US008493252B2

(12) United States Patent
Gorisse et al.

(10) Patent No.: US 8,493,252 B2
(45) Date of Patent: Jul. 23, 2013

(54) LOGARITHMIC ANALOG/DIGITAL CONVERSION METHOD FOR AN ANALOG INPUT SIGNAL, AND CORRESPONDING DEVICE

(75) Inventors: Jean Gorisse, Grenoble (FR); Andreia Cathelin, Laval (FR); Andreas Kaiser, Villeneuve d'Ascq (FR); Eric Kerherve, Talence (FR)

(73) Assignees: STMicroelectronics SA, Montrouge (FR); Centre National de la Recherche Scientifique (CNRS), Paris (FR)

( * ) Notice: Subject to any disclaimer, the term of this patent is extended or adjusted under 35 U.S.C. 154(b) by 155 days.

(21) Appl. No.: 13/032,115

(22) Filed: Feb. 22, 2011

(65) Prior Publication Data
US 2011/0205093 A1    Aug. 25, 2011

(30) Foreign Application Priority Data
Feb. 23, 2010   (FR) ..................... 10 51279

(51) Int. Cl.
*H03M 1/84* (2006.01)
(52) U.S. Cl.
USPC .......................... 341/138; 341/155
(58) Field of Classification Search
CPC ...................................... H03M 1/84
USPC ................. 341/144, 155, 118, 138
See application file for complete search history.

(56) References Cited

U.S. PATENT DOCUMENTS

| | | | | |
|---|---|---|---|---|
| 3,493,963 A | * | 2/1970 | Schluter Klaus | 341/170 |
| 4,113,997 A | * | 9/1978 | Horna | 379/406.06 |
| 4,625,197 A | * | 11/1986 | Holmes | 341/120 |
| 5,748,133 A | | 5/1998 | Distinti | 341/161 |
| 6,218,977 B1 | * | 4/2001 | Friend et al. | 341/163 |
| 7,126,509 B2 | * | 10/2006 | Sit et al. | 341/119 |
| 7,432,839 B2 | * | 10/2008 | Christ | 341/138 |
| 2006/0250290 A1 | | 11/2006 | Lauritzen et al. | 341/155 |
| 2008/0054163 A1 | * | 3/2008 | Suzunaga | 250/214 A |

OTHER PUBLICATIONS

Analog Devices, "1 MHz to 10 GHz, 45 dB Log Detector/Controller", AD8319, Rev. B, 2005-2008, pp. 1-20.
Ben-Yaakov et al., "An RC Logarithmic Converter-Digitizer", IEEE, vol. IM-27, No. 1, Mar. 1978, pp. 24-26.
Cantarano et al., "Logarithmic analog-to-digital converters: a survey", IEEE, vol. IM-22, No. 3, Sep. 1973, pp. 201-213.
Holdenried et al., "A DC-4-GHz true logarithmic amplifier: theory and implementation", IEEE Journal of Solid-State Circuits, vol. 37, No. 10, Oct. 2002, pp. 1290-1299.

(Continued)

*Primary Examiner* — Brian Young
(74) *Attorney, Agent, or Firm* — Allen, Dyer, Doppelt, Milbrath & Gilchrist, P.A.

(57) ABSTRACT

A logarithmic analog to digital conversion method for an analog input signal includes a logarithmic amplification with progressive compression of the input signal delivering a sequence of several secondary analog signals. The trend of the values of at least some of the secondary signals is a function of the values of the analog input signal including regions corresponding to a linear trend of the secondary signals as a function of that of the input signal expressed in a logarithmic scale. The method also includes a comparison of at least some of the secondary signals of the sequence with a common reference signal whose value lies within each of regions, supplying a thermometric code information item, and a generation of a first digital word from the thermometric code information item.

29 Claims, 25 Drawing Sheets

OTHER PUBLICATIONS

Lee et al., A 2.5mW 80dB DR 36dB SNDR 22MS/s logarithmic pipeline ADC, Symposium on VLSI Circuits Digest of Technical Papers, 2007, pp. 194-195.

Song et al., "A 10-b 15-MHz CMOS recycling two-step A/D converter", IEE journal of Solid-State Circuits, vol. 25, No. 6, Dec. 1990, pp. 1328-1338.

Zhou et al., "ADC architecture with direct binary output for digital controllers of high-frequency SMPS", SMPS Conference Proceedings, Aug. 2006, pp. 1-5.

Wongnamkam et al. "A 2.4 GHZ 43-0B CMOS Logarithmic Amplifier for FR Signal Level Detection" 978-1-4244-2101-5/08 IEEE 2008: pp. 725-728.

Lin et al. "A 15M 280 Mhz 80 DB Gain CMOS Limiting/Logarithmic Amplifier With Active Cascode Gain-Enhancement" ST Microelectronics. Downloaded on Jan. 22, 2009 From IEEE Xplore: ESSCIRC 2002; pp. 311-314.

Huang et al. "A Build-In Self-Test Technique for RF Low-Noise Amplifiers" ST Microelectronics. Downloaded on Jan. 22, 2009 From IEEE Xplore: IEEE Transactions on Microwave Theory and Techniques, vol. 56, No. 5, May 2008; pp. 1035-1042.

Townsend et al. "A CMOS Integrated Power Detector for UWB" ST Microelectronics. Downloaded on Jan. 22, 2009 From IEEE Xplore: 2007 IEEE. Jan. 4244-0921-7/07; pp. 3039-3042.

Khorram et al. "A CMOS Limiting Amplifier and Signal-Strength Indicator" ST Microelectronics. Downloaded on Jan. 22, 2009 From IEEE Xplore: 1995 Symposium on VLSI Circuits Digest of Technical Papers; pp. 95-96.

Analog Devicee—"Low Cost, DC to 500 MHZ, 92 DB Logarithmic Amplifier" AD8307: www.analog.com; Jul. 2008, pp. 1-24.

Nash, Eamon "Ask the Application Engineer—28" Analog Dialogue 33-3 (1999) pp. 1-5.

* cited by examiner

FIG. 11

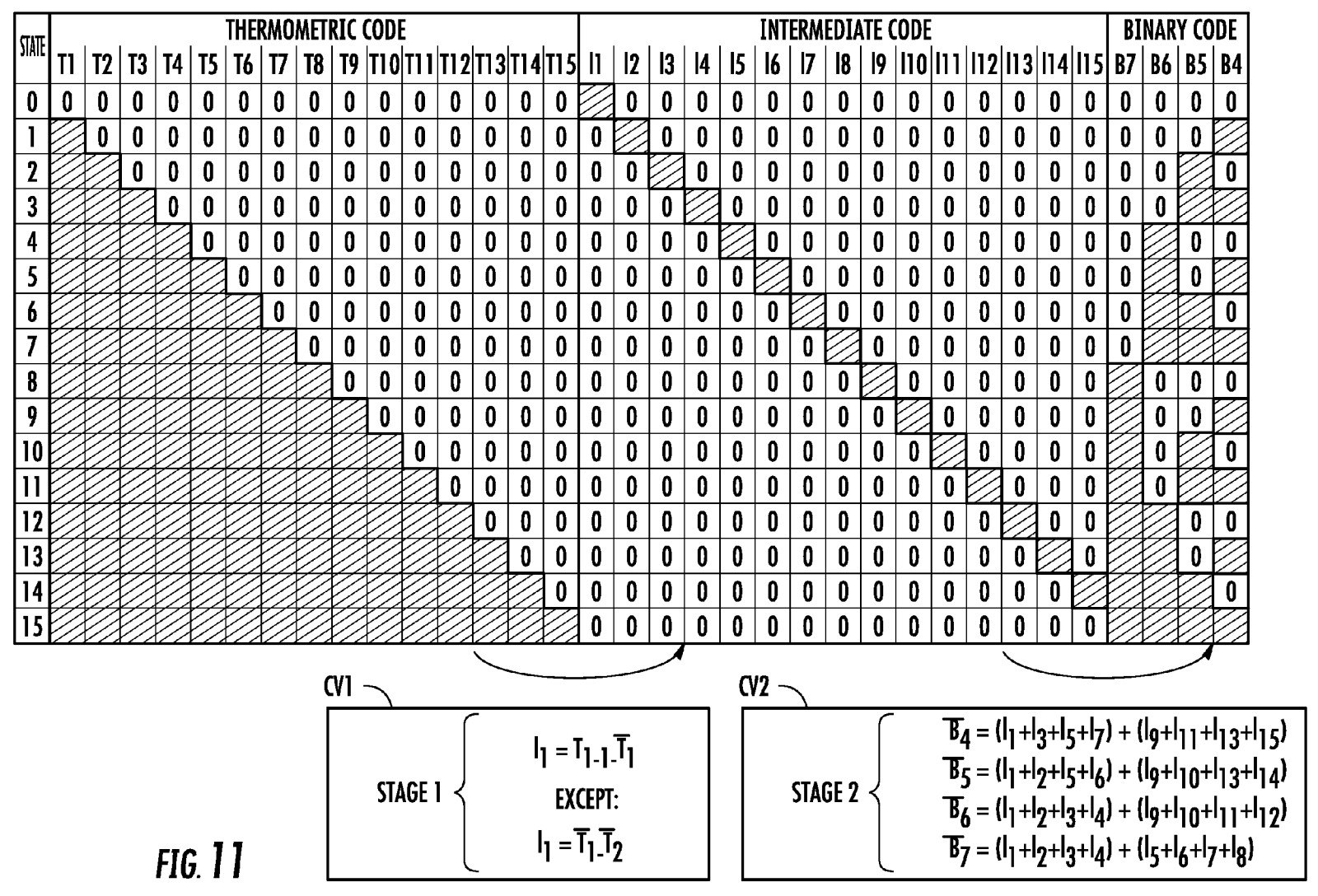

Stage 1 (CV1):
$$I_j = T_{j-1} \cdot \overline{T_j}$$
EXCEPT:
$$I_1 = \overline{T_1} \cdot \overline{T_2}$$

Stage 2 (CV2):
$$\overline{B_4} = (I_1+I_3+I_5+I_7) + (I_9+I_{11}+I_{13}+I_{15})$$
$$\overline{B_5} = (I_1+I_2+I_5+I_6) + (I_9+I_{10}+I_{13}+I_{14})$$
$$\overline{B_6} = (I_1+I_2+I_3+I_4) + (I_9+I_{10}+I_{11}+I_{12})$$
$$\overline{B_7} = (I_1+I_2+I_3+I_4) + (I_5+I_6+I_7+I_8)$$

"COARSE" BITS

| 0000 | 0001 | 0010 | 0011 | 0100 | 0101 | 0110 | 0111 | 1000 | 1001 | 1010 | 1011 | 1100 | 1101 | 1110 | 1111 |
|---|---|---|---|---|---|---|---|---|---|---|---|---|---|---|---|
| 111110 | 000010 | 000110 | 001000 | 001110 | 010010 | 010111 | 010110 | 011110 | 100010 | 100110 | 101000 | 110000 | 110011 | 110110 | 110110 |

LOGARITHMIC ANALOG/DIGITAL CONVERSION METHOD FOR AN ANALOG INPUT SIGNAL, AND CORRESPONDING DEVICE

FIELD OF THE INVENTION

The invention relates to the analog to digital conversion of an analog signal, and, more particularly, a logarithmic analog to digital conversion, which is particularly useful when the analog signal is representative of a physical quantity (electrical, thermal, etc.) through an exponential law.

BACKGROUND OF THE INVENTION

With a linear analog to digital converter, the physical quantity variation corresponding to a variation of a least significant bit in the output digital word delivered by a digital to analog converter depends on the value of this digital word.

This is why a logarithmic analog to digital converter is preferentially used, in which this variation of a least significant bit may represent the same physical quantity variation regardless of the value of the digital word delivered as output from the converter.

There are numerous logarithmic analog to digital converter structures. Notable among these are the architectures that use an operational amplifier with a diode connected between the output and the negative input of this operational amplifier. Such devices do, however, have a strong dependency on the temperature and a very poor loop stability which leads to a limited conversion dynamic range.

Also worth citing are the analog to digital converters that use switched capacitance pipelined architectures. Such architectures are notably very complex to produce and have a high current consumption.

SUMMARY OF THE INVENTION

According to one embodiment, there is a logarithmic analog to digital converter architecture that has a wide dynamic range of operation and also offers production flexibility.

In addition, according to one implementation and embodiment, there is also a logarithmic analog to digital converter architecture capable of operating under a low power supply voltage with a low current consumption and that has a reduced size.

Furthermore, according to one embodiment and implementation, there is a method based on a logarithmic progressive compression with, optionally, the use of a linear analog to digital converter.

More specifically, the logarithmic amplifier device with progressive compression generates, between each compression amplifier, a voltage which is linear over a short region relative to the input voltage of the amplifier device, when it is expressed in a logarithmic scale. By comparing at least some of the voltages generated with a common reference, a thermometric code is obtained which indicates the region in which the input voltage lies. The thermometric code is then converted into a binary code to form the most significant bits of an output digital word. These bits can be considered as "coarse" bits because they result from a so-called "coarse" first conversion.

When greater precision is desired, the thermometric code information item can also be used to select, through an analog multiplexer, the linear region of one of the voltages generated. The duly selected voltage is then digitized through a linear analog to digital converter so as to generate the finer resolution bits of the output digital word delivered by the converter. These bits may then be considered as "fine" bits, because they result from a so-called "fine" second conversion.

Thus, according to one aspect, there is a logarithmic analog to digital conversion method for an analog input signal. The method includes a logarithmic amplification with progressive compression of the input signal delivering a sequence of several secondary analog signals, the trend of the values of at least some of the secondary signals as a function of the values of the analog input signal including regions corresponding to a linear trend of the secondary signals as a function of that of the input signal expressed in a logarithmic scale. The method also includes a comparison of at least some of the secondary signals of the sequence with a common reference signal whose value lies within each of the regions, supplying a thermometric code information item. The method further includes a generation of a first digital word from the thermometric code information item.

In order to make use of the linear region of each secondary signal, the value of the reference signal is preferentially chosen such that, when a secondary signal of rank i in the sequence takes the value equal to the value of the reference signal, the corresponding value of the secondary signal of rank i−1 lies within the region of the secondary signal of rank i−1.

Thus, in practice, it is possible, for example, to choose a reference value lying in the vicinity of the bottom value of each region.

According to one implementation, the generation of the first digital word comprises a conversion of the thermometric code information item into an intermediate code information item, a bit of rank i of the intermediate code information item being obtained from the product of the complement of the bit of rank i and of the bit of rank i−1 or of its complement, of the thermometric code information item, and a conversion of the intermediate code information item into a binary code information item forming the first digital word.

When there is a desire to improve the resolution of the analog to digital conversion, provision is made, according to one implementation, for the method to also comprise a selection of one of the secondary signals of the sequence from the thermometric code information item, a secondary analog to digital conversion of the selected secondary signal, a secondary thermometric code information item and a conversion of this secondary thermometric code information item into a second digital word. The first and second digital words respectively form first and second portions of an output digital word, the second portion having a lower significance than the first portion.

In other words, the bits of the first digital word form so-called "coarse" bits of the output digital word, whereas the bits of the second digital word form "fine" bits of the output digital word. The selection of the secondary signal is advantageously made from the intermediate code information item.

According to one implementation, the linear regions extend at least between a first common bottom limit value and a first common top limit value, and the secondary analog to digital conversion of the selected secondary signal comprises a comparison of the secondary signal with reference thresholds evenly distributed between the first common bottom limit value and the first common top limit value.

That being the case, the linearity of the analog to digital converter depends on the correlation between the coarse bits and the fine bits, which is in particular directly affected by the precision of the comparators performing the comparisons with the common reference signal.

In other words, an error in the coarse conversion may induce an error in the selected segment, that may result in the output of the analog multiplexer, which performs the selection, exceeding the conversion range of the secondary analog to digital converter. To remedy this, it is helpful to increase the conversion range of the secondary analog to digital converter by adding additional reference thresholds. It then becomes useful to correlate the fine bits with the coarse bits to form a unique continuous output digital code.

In other words, when certain applications to compensate for such possible errors, provision is advantageously made, according to one implementation, for the secondary analog to digital conversion of the selected secondary signal to comprise a comparison of the secondary signal with reference thresholds evenly distributed between a second bottom limit value lower than the first common bottom limit value, and a second top limit value higher than the first common top limit value; this amounts to adding comparison thresholds within the conversion range of the secondary analog to digital converter.

The method then also comprises a calibration of the analog to digital conversion with a calibration analog signal as input signal; this calibration signal follows a monotonic time trend. The method then comprises a generation of a mapping table between the first and second digital words successively obtained during the analog to digital conversion of the calibration signal and of the desired output digital words together forming a continuous binary digital code.

According to another aspect, there is a logarithmic analog to digital conversion device, comprising input means or circuitry configured to receive an analog input signal, and processing means or circuitry connected to the input means or circuitry.

According to a general feature of this aspect, the processing means or circuitry comprise logarithmic amplification means or circuitry with progressive compression connected to the input means or circuitry and including a chain of several amplifier stages configured each to deliver a secondary analog signal. The trend of the values of at least some of the secondary analog signals follows as a function of the values of the input analog signal including regions corresponding to a linear trend of the secondary signals as a function of that of the input signal expressed in a logarithmic scale.

Several comparison means or circuits respectively have several first inputs respectively connected to the outputs of at least some of the amplifier stages, several second inputs configured each to receive a common reference signal whose value lies within each of the regions, and several outputs configured to deliver a thermometric code information item.

First conversion means or circuitry is connected to the outputs of the comparison means or circuitry and configured to deliver a first digital word from the thermometric code information item.

According to one embodiment, the value of the reference signal is chosen such that, when a secondary signal of rank i in the sequence takes the value equal to the value of the reference signal, the corresponding value of the secondary signal of rank i−1 lies within the region of this secondary signal of rank i−1.

According to one embodiment, the first conversion means or circuitry comprises a first conversion block configured to convert the thermometric code information item into an intermediate code information item, a bit of rank i of the intermediate code information item being obtained from the product of the complement of the bit of rank i and of the bit of rank i−1 or of its complement of the thermometric code information item, and a second conversion block configured to convert the intermediate code information item into a binary code information item forming the first digital word.

According to one embodiment, the processing means or circuitry also comprise multiplexing means or circuitry having several inputs respectively connected to the outputs of at least some of the amplifier stages, an output and a command input connected to the outputs of the comparison means or circuitry. Secondary analog to digital conversion means or circuitry are connected to the output of the multiplexing means or circuitry and configured to deliver a secondary thermometric code information item.

Second conversion means or circuitry are configured to convert the secondary thermometric code information item into a second digital word from the selected secondary signal delivered at the output of the multiplexing means or circuitry, the first and second digital words respectively forming first and second portions of an output digital word, the second portion having a lower significance than the first portion.

According to one embodiment, the command input is coupled to the output of the first conversion block. According to one embodiment, the regions extend at least between a first common bottom limit value and a first common top limit value and the secondary analog to digital conversion means circuitry comprise a network of secondary comparators configured to perform a comparison of the secondary signal with reference thresholds evenly distributed between the first common bottom limit value and the first common top limit value.

According to one embodiment, the secondary analog to digital conversion means or circuitry comprises a network of secondary comparators configured to perform a comparison of the secondary signal with reference thresholds evenly distributed between a second bottom limit value lower than the first common bottom limit value and a second top limit value higher than the first common top limit value. The device also comprises calibration means or circuitry configured to perform a calibration of the processing means or circuitry with an analog calibration signal as input signal, this calibration signal following a monotonic time trend, the calibration means or circuitry including generation means or circuitry configured to generate a mapping table between the first and second digital words successively obtained during the analog to digital conversion of the calibration signal and of the desired output digital words together forming a continuous binary digital code.

BRIEF DESCRIPTION OF THE DRAWINGS

Other advantages and features of the invention will become apparent from studying the detailed description of implementations and embodiments which are by no means limiting, and the appended drawings in which:

FIGS. 6 to 18 illustrate in more detail various portions of the device of FIG. 5 and various implementations of an analog to digital conversion method according to the invention, FIGS. 19 to 24 schematically illustrate another embodiment and another implementation of the invention, and FIG. 25 schematically illustrates an exemplary application of an analog to digital conversion device according to the invention.

DETAILED DESCRIPTION OF THE PREFERRED EMBODIMENTS

Figure 1:
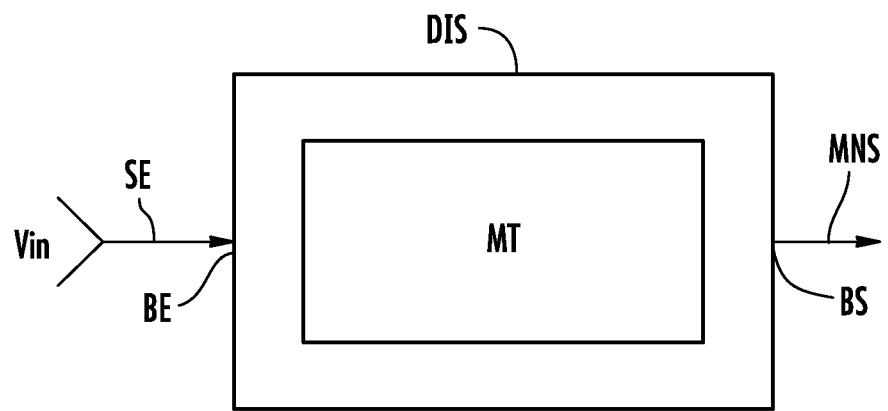
FIG. 1 very schematically illustrates one embodiment of an analog to digital conversion device according to the invention.

In FIG. 1, the reference DIS globally designates an analog to digital conversion device according to the invention. This device DIS includes input means or circuitry BE for receiving an analog input signal SE, for example an analog voltage Vin.

The device also includes an output terminal BS delivering an output digital word MNS corresponding to the analog input signal. Finally, processing means or circuitry MT are connected between the input means or circuitry BE and the output means or circuitry BS.

Figure 2:
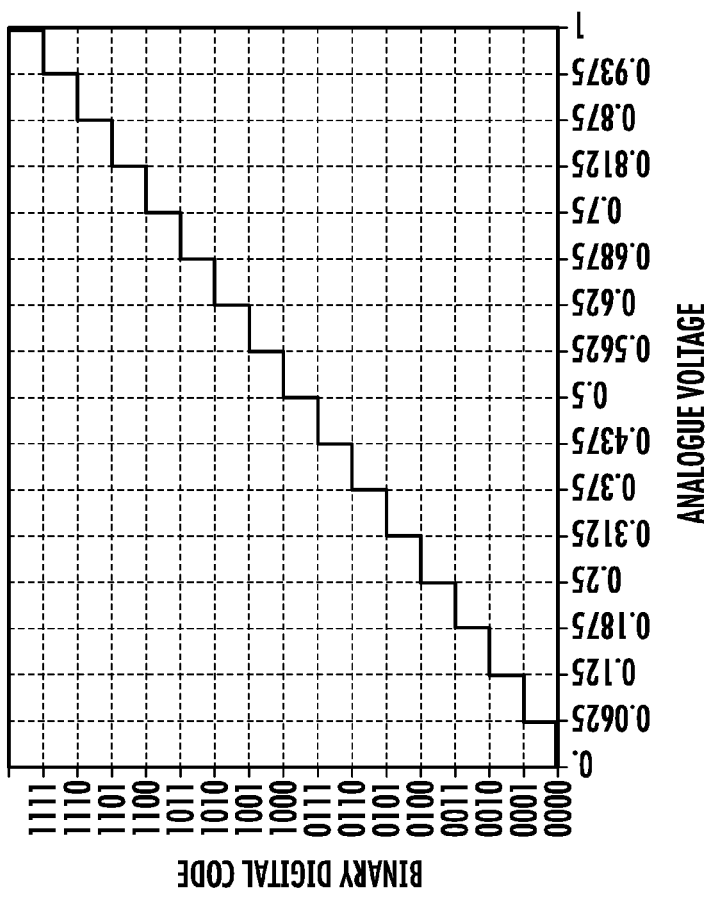
FIG. 2 illustrates an exponential-type trend of an analog voltage representing a physical quantity, and a binary digital code resulting from the conversion of this analog voltage, according to the invention, FIGS. 3 and 4 schematically illustrate variations of a least significant bit relative to a physical quantity variation in a linear analog/digital converter and in a logarithmic analog/digital converter, respectively, according to the invention.
Figure 2:
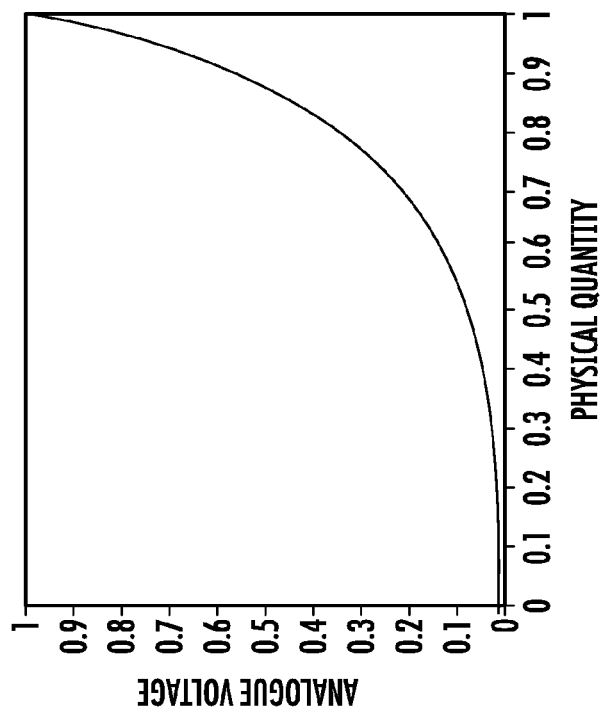

The device DIS is, in this case, a logarithmic analog to digital conversion device because the analog input voltage Vin represents, as illustrated in the left-hand portion of FIG. 2, a physical quantity, for example an electrical, thermal, or similar quantity, through an exponential law. The output digital word MNS is, for example, one of the digital words of the binary digital code that corresponds, after analog to digital conversion, to the analog input voltage, and illustrated in the right-hand portion of FIG. 2.

Figure 3:
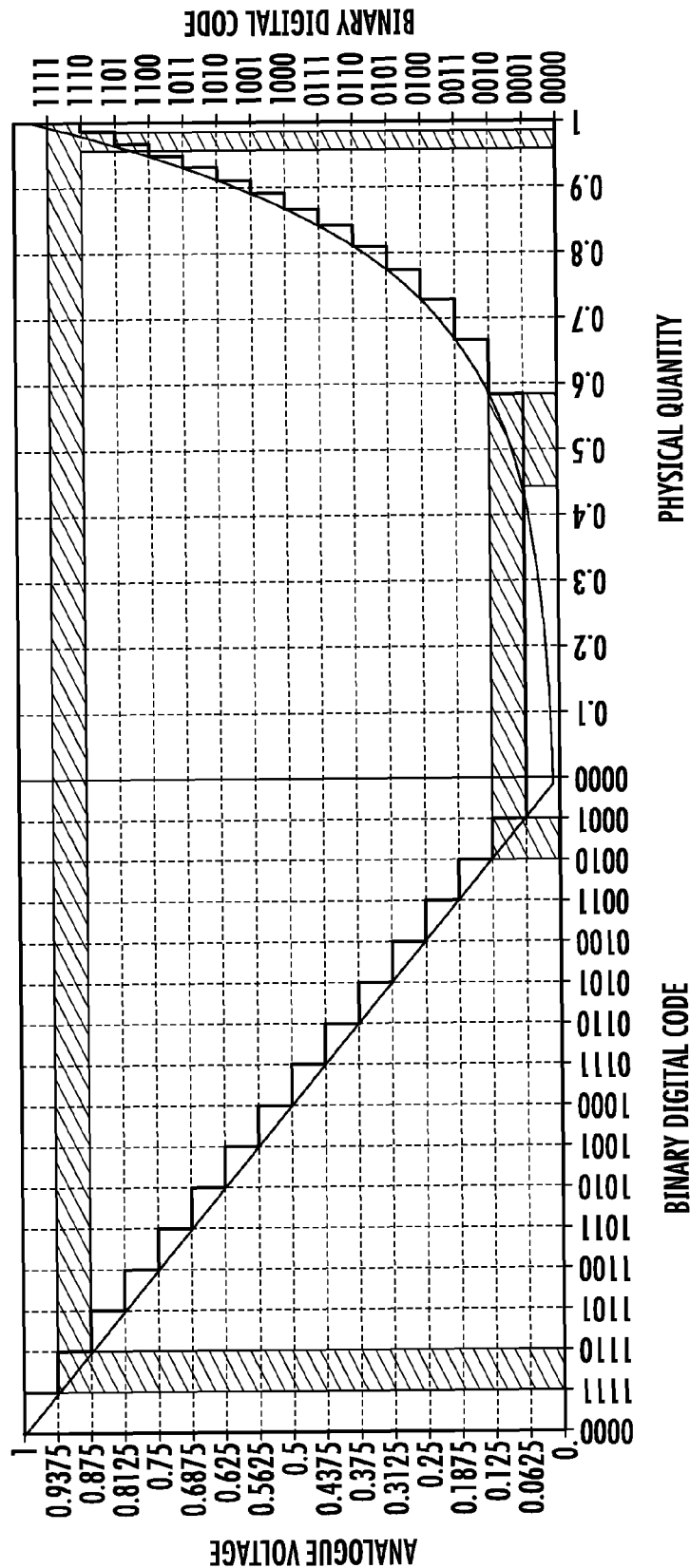

As illustrated in FIG. 3, in a conventional linear analog to digital converter, the variation of a least significant bit of an output digital word does not represent the same physical quantity variation depending on whether this least significant bit variation corresponds to a digital word situated in the bottom part or in the top part of the binary digital code.

Figure 4:
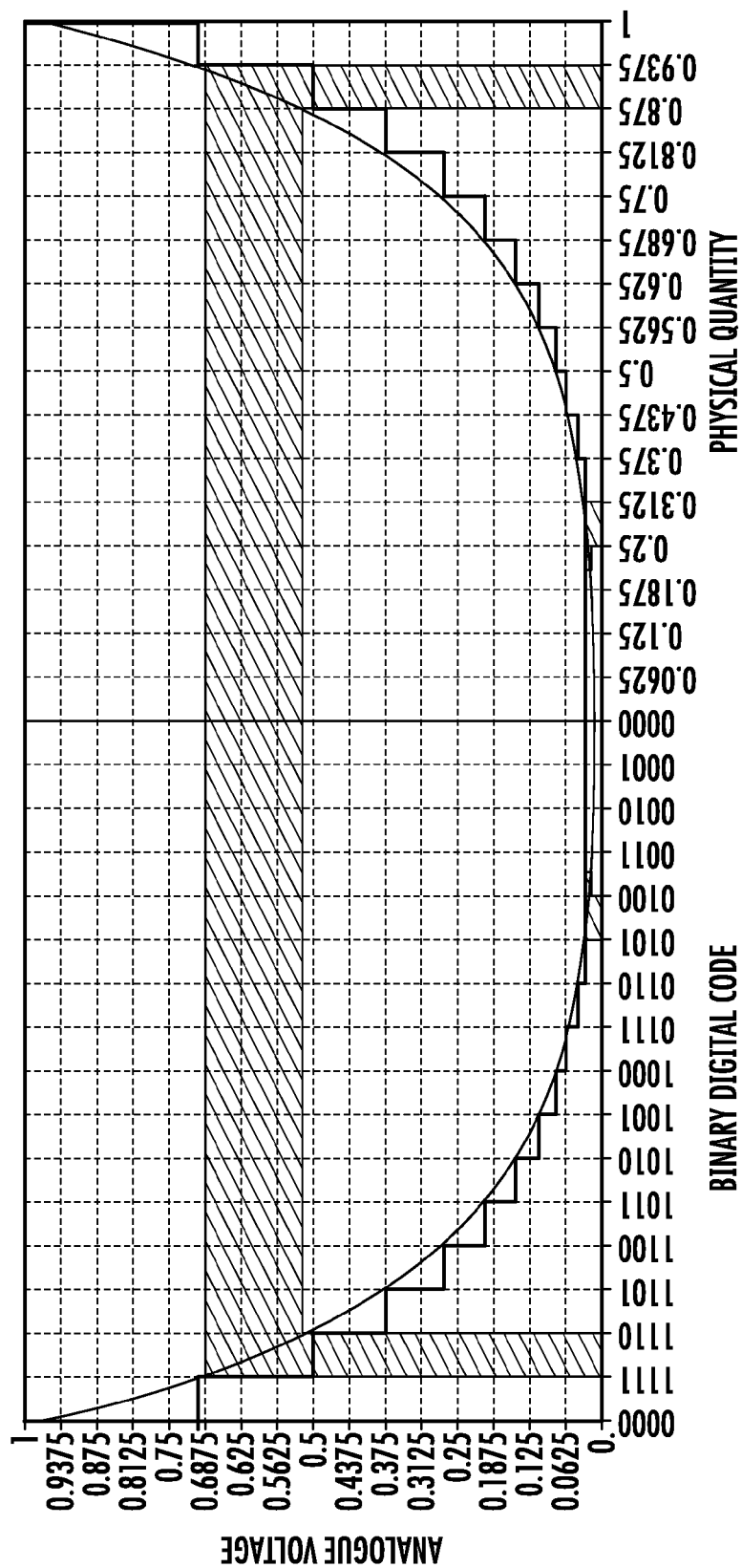

This is why the device DIS is a logarithmic analog to digital conversion device for which the variation of a least significant bit in a digital word of the output binary digital code represents the same physical quantity variation regardless of the value of this output digital word (FIG. 4).

Figure 5:
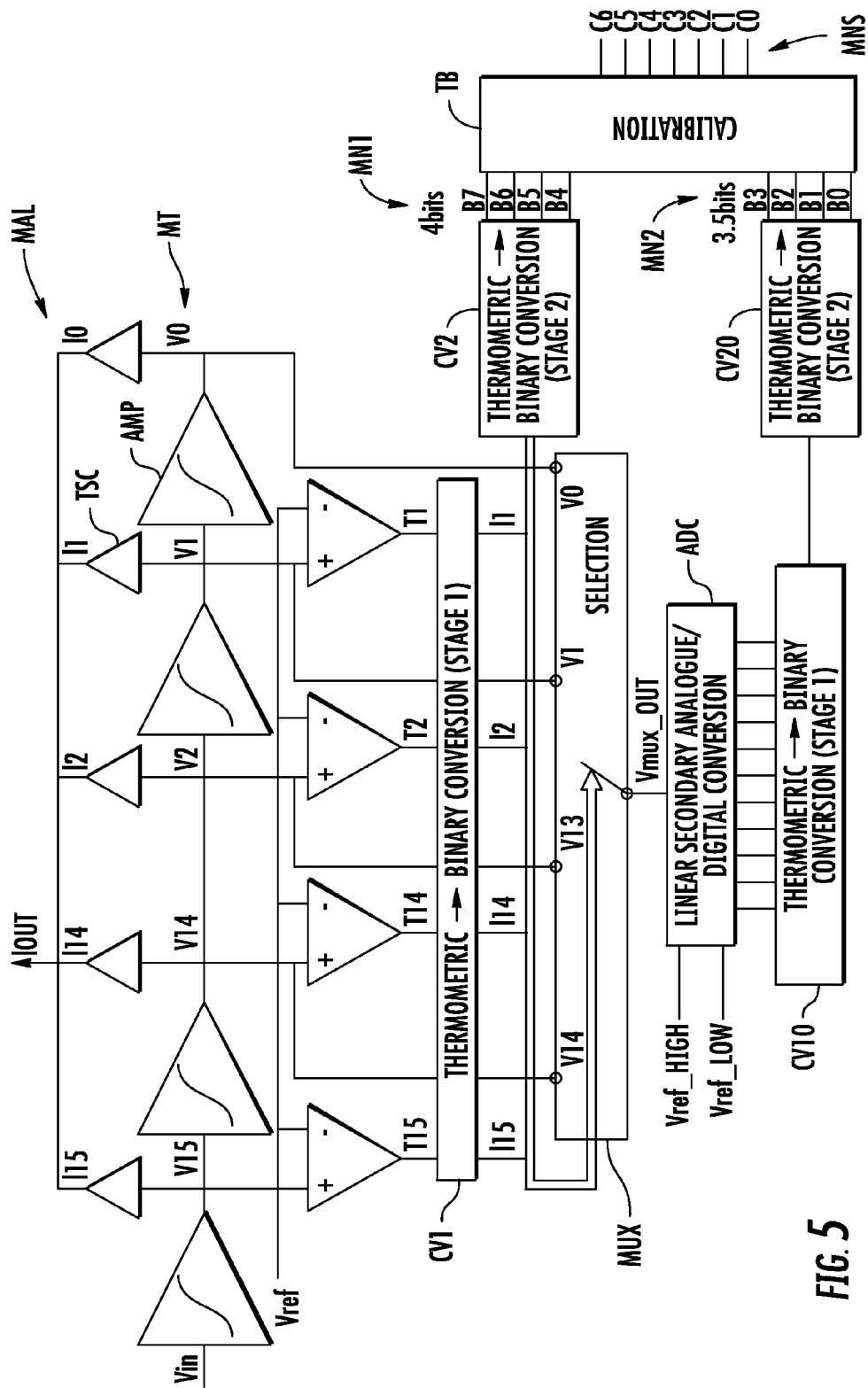
FIG. 5 illustrates in more detail, but still schematically, one embodiment of a device according to the invention.

As illustrated in FIG. 5, the processing means or circuitry MT of the device DIS comprises logarithmic amplification means or circuitry with progressive compression MAL.

These means or circuitry MAL include a chain of several amplifier stages AMP, in this case 16 amplifier stages, for example class A or AB amplifiers, configured each to deliver a secondary analog signal Vi. In the example described here, the means MAL therefore deliver 16 secondary analog signals V0-V15.

Conventionally, transconductor elements TSC are connected between the output of each amplifier stage AMP and the analog output of the means or circuitry MAL. These transconductor elements perform a voltage-current conversion, the analog output current Iout being equal to the sum of the currents I0-I15 respectively delivered by the transconductor elements TSC.

Figure 6:
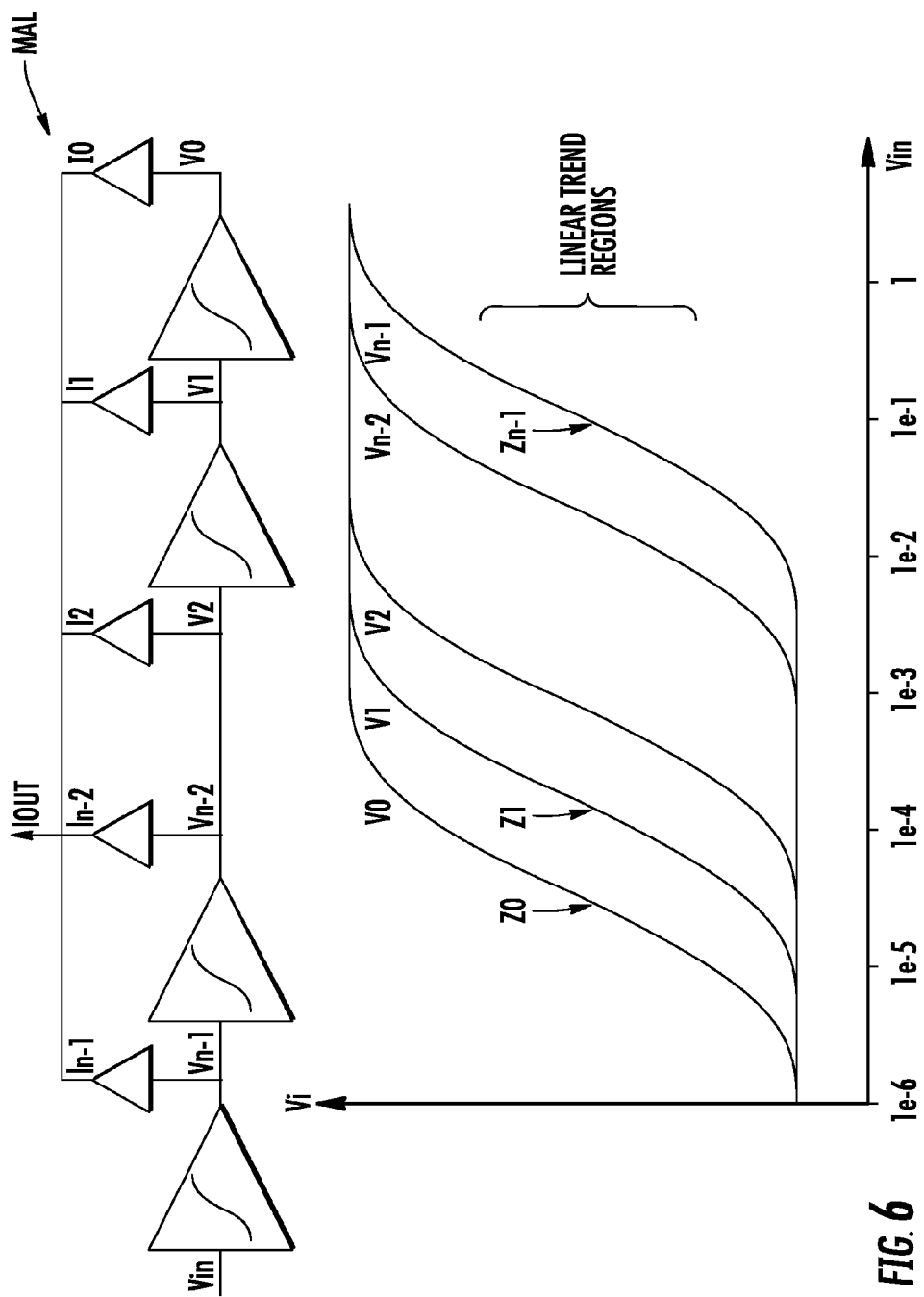

Generally, as illustrated more specifically in FIG. 6, the trend of the values of each secondary analog signal Vi, as a function of the values of the analog input signal Vin, includes a region Zi corresponding to a linear trend of the secondary signal Vi as a function of that of the input signal Vin expressed in a logarithmic scale.

In addition to these logarithmic amplification means with progressive compression MAL, the processing means or circuitry comprise several comparison means or circuits CMP, in this case 15 comparison means or comparators CMP.

Each comparator has a first input, in this case the positive input, a second input, in this case the negative input, and an output. The second inputs of the comparators receive a common reference signal, namely a common reference voltage Vref.

The first inputs of the comparators CMP are connected to the outputs of some of the amplifier stages of the amplification means or circuits MAL, namely to the outputs of the first 15 stages so as to respectively receive the secondary analog signals V15-V1.

When, as is the case here, a secondary analog to digital converter ADC is used within the processing means or circuitry, as will be seen in more detail hereinbelow, to supply the fine bits of the output digital word, it may be less helpful to provide a sixteenth comparator CMP which would be intended to compare the secondary signal V0 with the common reference voltage Vref because, in such an application, the duly obtained information corresponds to the conversion minimum threshold and is then redundant with the information item supplied by this secondary analog to digital converter.

Figure 7:
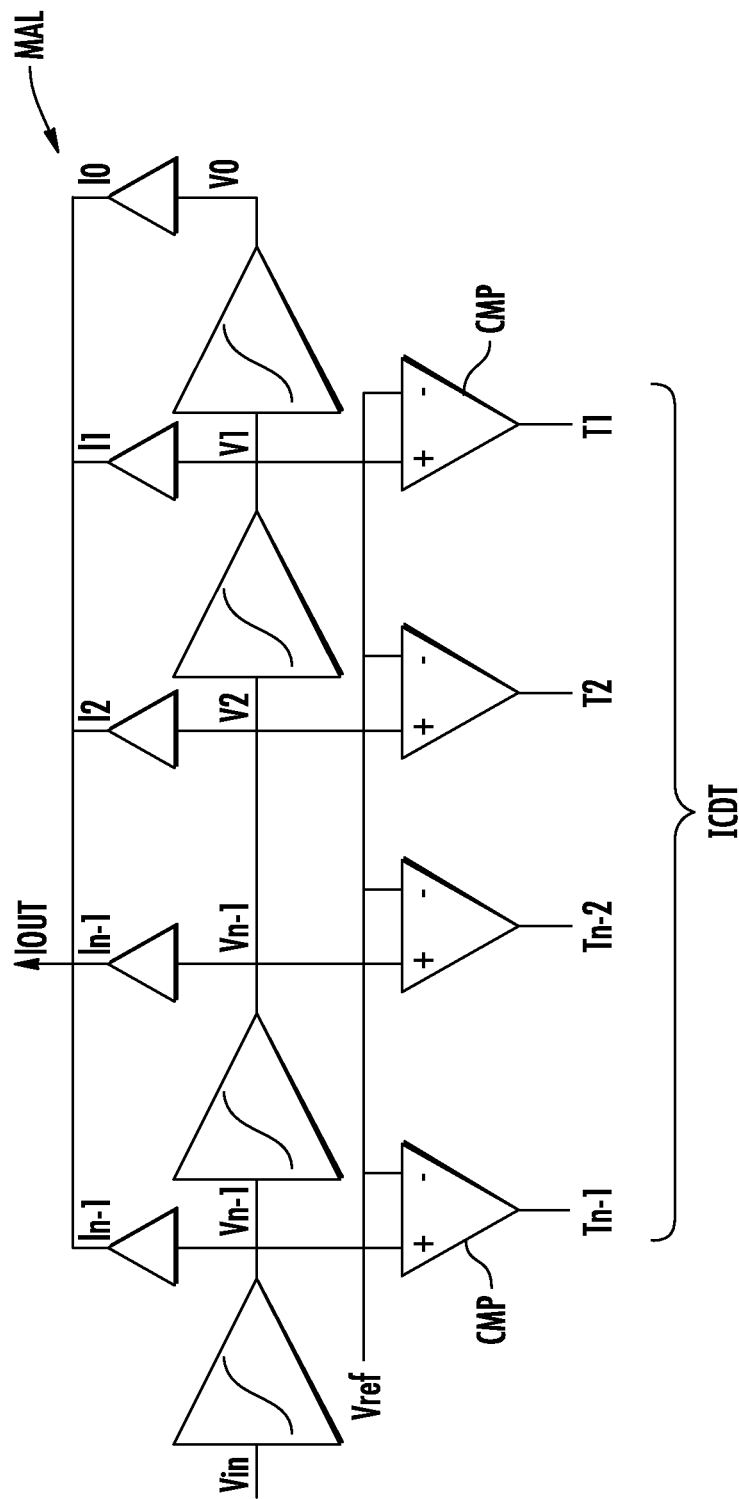
Figure 8:
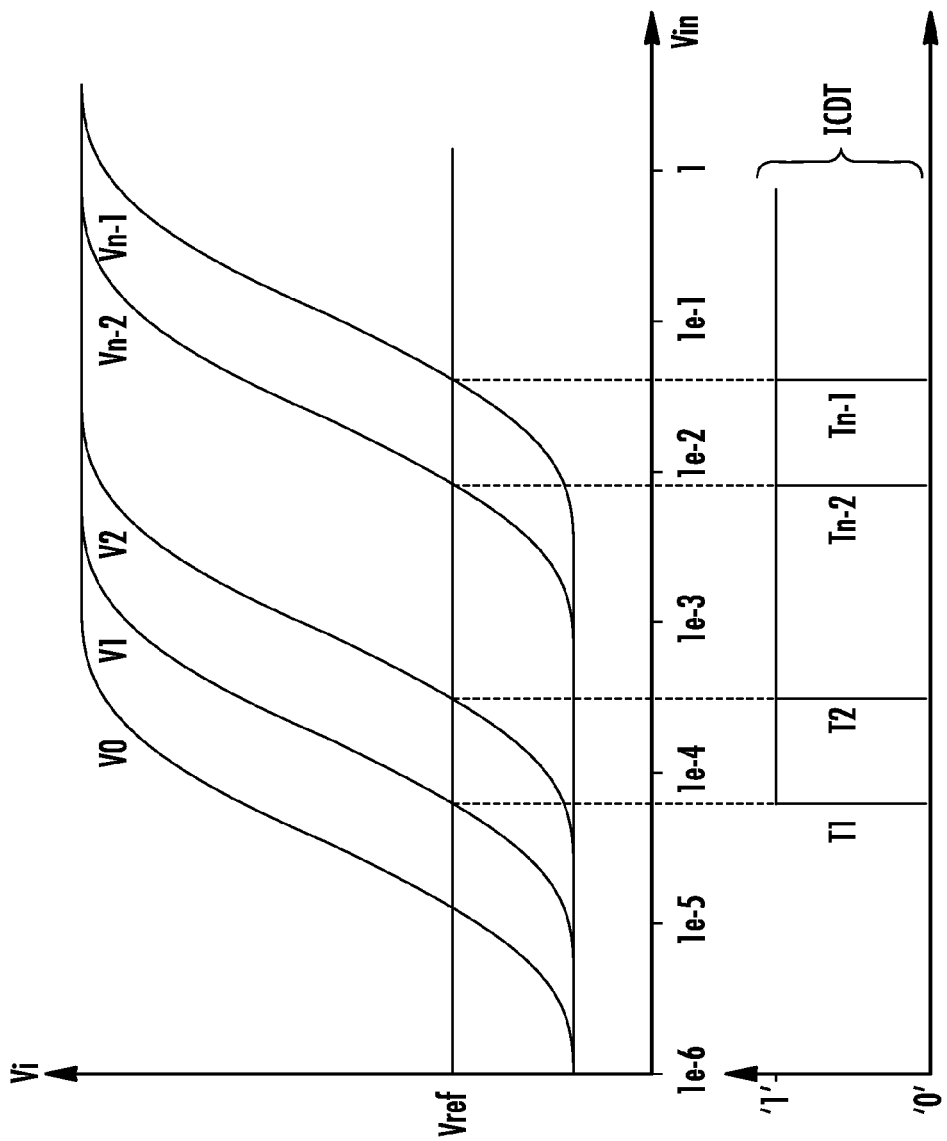

As illustrated in FIG. 7 and in FIG. 8, the binary information items T1 to Tn-1 (for example T1 to T15) together form a thermometric code information item ICDT. More specifically, when the secondary analog signal Vi is greater than the common reference voltage Vref, the corresponding bit Ti takes the logic value 1.

It will be recalled here that a thermometric code is a code in which the digital word formed by the bits T1-Tn−1 is likely to change from the minimum value, for which all the bits are at zero, to the maximum value, for which all the bits are at 1, by successive transitions to 1 of the various bits from the least significant bit to the most significant bit.

In other words, a bit of given significance cannot change to 1 if the bit of immediately lower significance has not already changed to 1. Such a code is called "thermometric" by analogy with the progressive rise of mercury in a thermometer.

Figure 9:
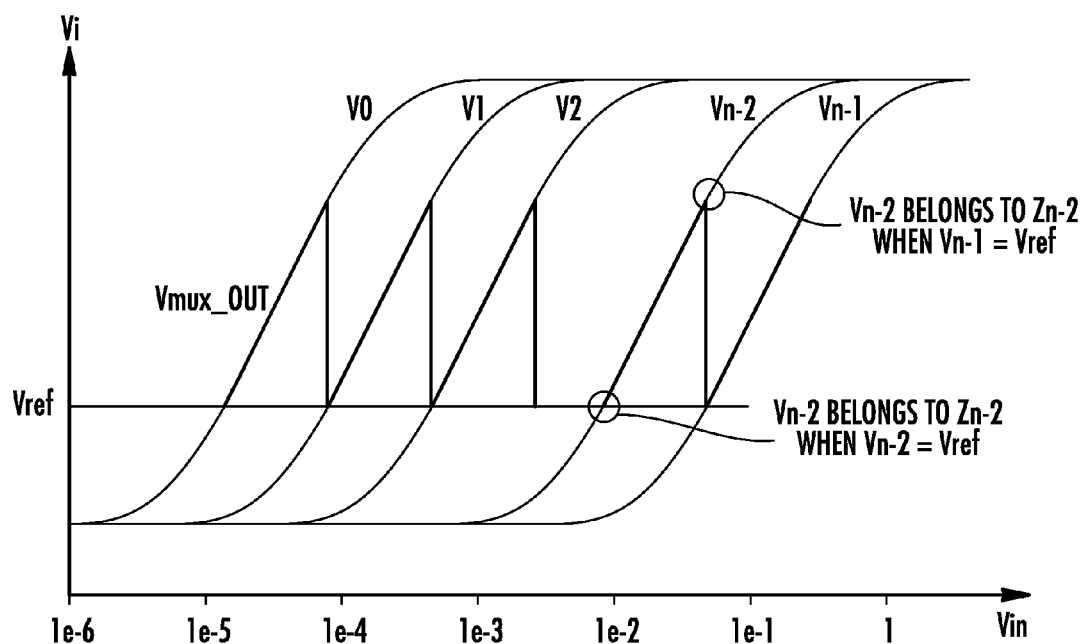

As illustrated in FIG. 8 and in FIG. 9, the value of the reference signal Vref is chosen such that its value is situated in each of the linear regions of a secondary signal.

Moreover, so as to optimize the use of the linear regions Zi, this value Vref is chosen such that, when a secondary signal of rank i takes the value equal to the value of the reference signal, the corresponding value of the secondary signal of rank i−1 is situated in the linear region Zi−1 of this secondary signal of rank i−1.

In practice, the reference value Vref is, for example, a value that is situated in the vicinity of the bottom value of each linear region Zi.

Figure 10:
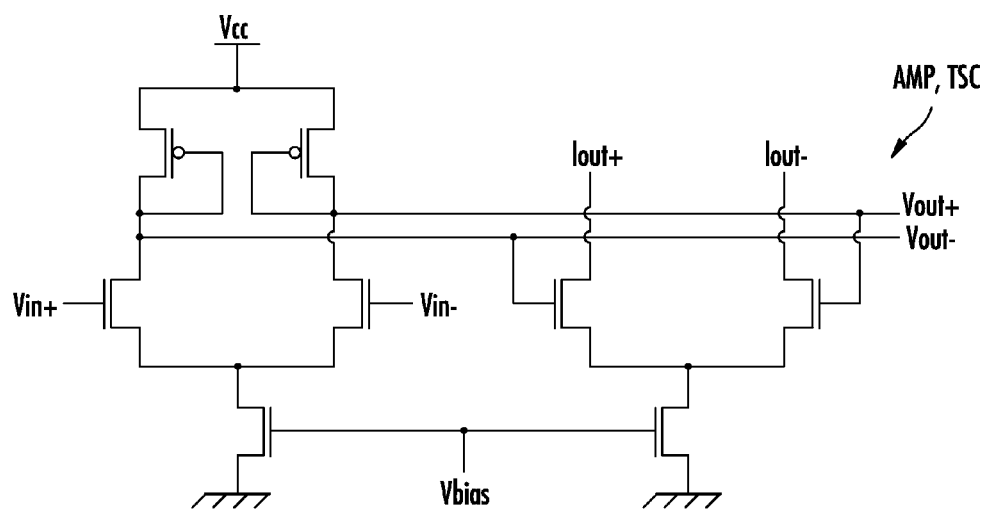

An exemplary embodiment of an amplifier AMP and of the transconductor element TSC in a differential structure, is illustrated in FIG. 10. In this figure, the voltages Vin+ and Vin− designate the differential input voltage of the amplifier whereas the voltages Vout+ and Vout− designate the differential output voltage. The outputs Iout+ and Iout− designate, on their structure, the differential current output from the element TSC.

The thermometric code information item ICDT is converted into a first digital word MN1 (FIG. 5) through first conversion means or circuitry connected to the outputs of the comparison means CMP. More specifically, in this embodiment, the first conversion means or circuitry in fact comprises two conversion stages CV1 and CV2.

In practice, as illustrated in FIG. 11, the thermometric code information is first of all converted into an intermediate code and then into a binary code. The first conversion means or circuitry consequently comprises a first conversion block CV1 for converting the thermometric code information item into an intermediate code information item I1-I15, by using the equations mentioned in FIG. 11.

Figure 12:
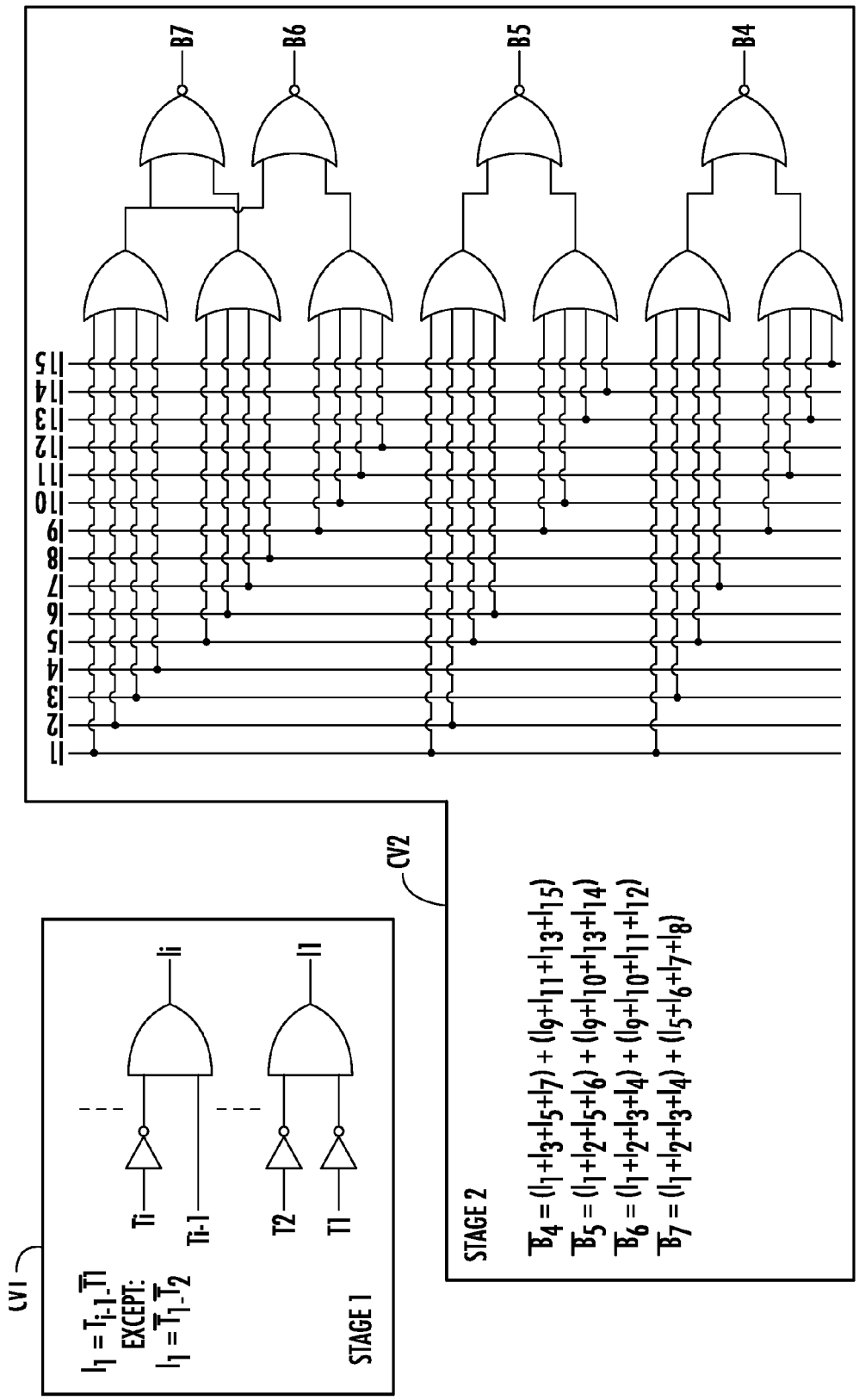

More specifically, a bit Ii of rank i of the intermediate code information item is obtained from the product $T_{i-1} \cdot T_i$, except with respect to the bit I1 which is obtained by the product $\overline{T}_1 \cdot T_2$. As illustrated in FIG. 12, the conversion block CV1 may be produced simply from inverters and AND logic gates.

The second conversion block CV2 will convert the intermediate code information item I1-I15 into the bits, in this case the four bits $B_4$-$B_7$, of the first digital word MN1 based on the equations illustrated in FIG. 11.

Here too, as illustrated in FIG. 12, the block CV2 may be produced simply from OR and NON-OR logic gates. Thus, the logarithmic analog to digital converter generates, between each amplifier stage, a secondary analog signal (voltage) which is generally linear over a short section (relative to the input voltage Vin expressed in a logarithmic scale). By comparing all the voltages generated in this way with a reference voltage, a thermometric code is obtained which indicates the section in which the input voltage is situated. The thermometric code is then converted into a binary code to form the bits of the first digital word MN1. These bits form "coarse" bits.

Figure 13:
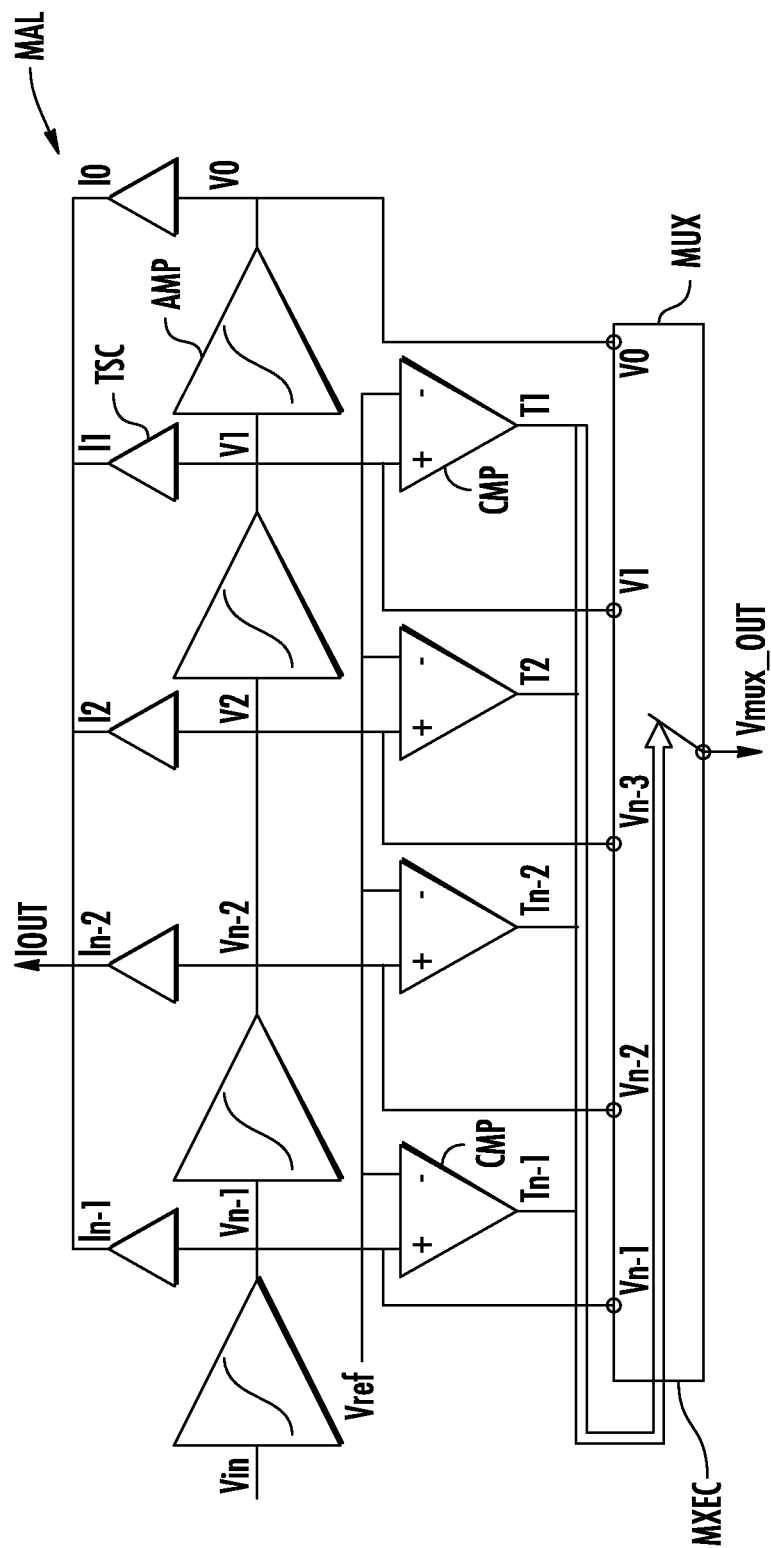

That said, when, in certain applications, it is helpful to have a finer resolution, provision is made, as illustrated in FIG. 13, for the processing means or circuitry to also include multiplexing means or circuitry MUX having several inputs generally respectively connected to the outputs of the amplifier stages. This is the case illustrated in FIG. 13.

That said, in certain practical implementations, it is possible for the secondary signal Vn−1 (the signal V15 in the case of FIG. 15) to include a linear region that is too small to be correctly usable. In this case, the selection of the signal V15 which should be made when all the bits from T1 to T15 are at 1, is not implemented. Such is the case illustrated in FIG. 5.

Thus, in this case, the multiplexing means or circuitry have several inputs respectively connected to the outputs of some of the amplifier stages, so as to receive only some of the secondary analog signals, namely, in the present case, the signals V0-V14. The multiplexer MUX also has an output delivering the signal Vmux_out which will be one of the secondary signals present at the input of the multiplexer MUX.

Figure 14:
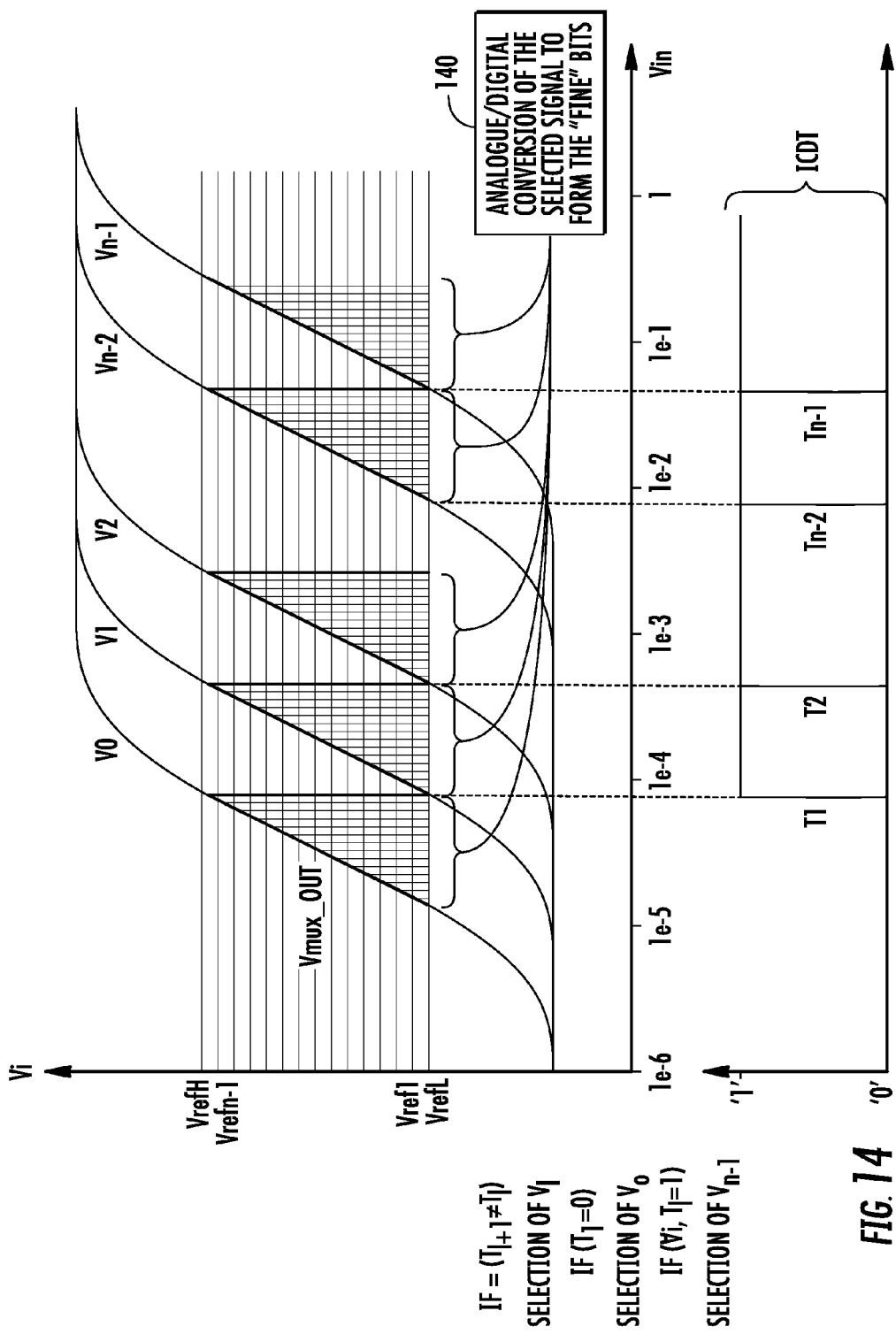

The multiplexer MUX also includes a command input MXEC linked to the output of the comparison means CMP. Thus, as illustrated in FIG. 14, if $T_{i+1}$ is different from $T_i$, the signal Vi is then selected. If T1 is equal to 0, the signal V0 is selected and, if, regardless of i, $T_i$ is equal to 1, then the signal Vn−1 is selected.

Then, the selected signal Vmux_out will undergo an analog to digital conversion 140 to form the "fine" bits B0, B1, B2, B3 of a second digital word MN2. Thus, the output digital word MNS of the logarithmic analog to digital converter is formed from the first digital word MN1 and the second digital word MN2, the bits B0-B3 of the digital word MN2 having a lower significance than the bits B4-B7 of the digital word MN1.

When, as illustrated in FIG. 5, provision is made for a conversion of the thermometric information T1-T15 to the bits of the digital word MN1 in two stages CV1-CV2, the command input of the multiplexer MUX is connected directly to the bits I1-I15 of the intermediate code, and consequently indirectly to the bits T1-T15 of the thermometric code.

Figure 15:
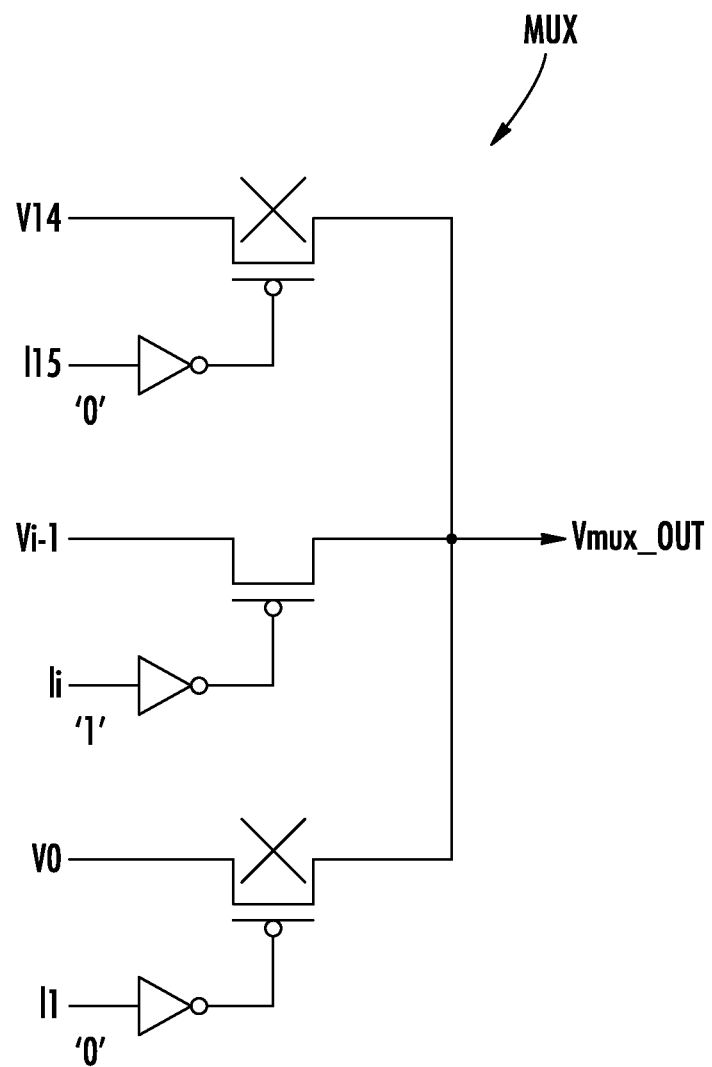

An exemplary embodiment of the multiplexer MUX is then illustrated in FIG. 15. It can be seen that the multiplexer MUX in this case comprises the PMOS transistors whose gates form the command input of this multiplexer MUX.

When, in particular, the comparator stage CMP is sufficiently precise, the "linear" regions of the secondary analog signals Vi extend, as illustrated in FIG. 14, between a first common bottom limit VrefL, which is generally taken to be equal to the common reference voltage Vref, and a common top limit value VrefH.

Figure 16:
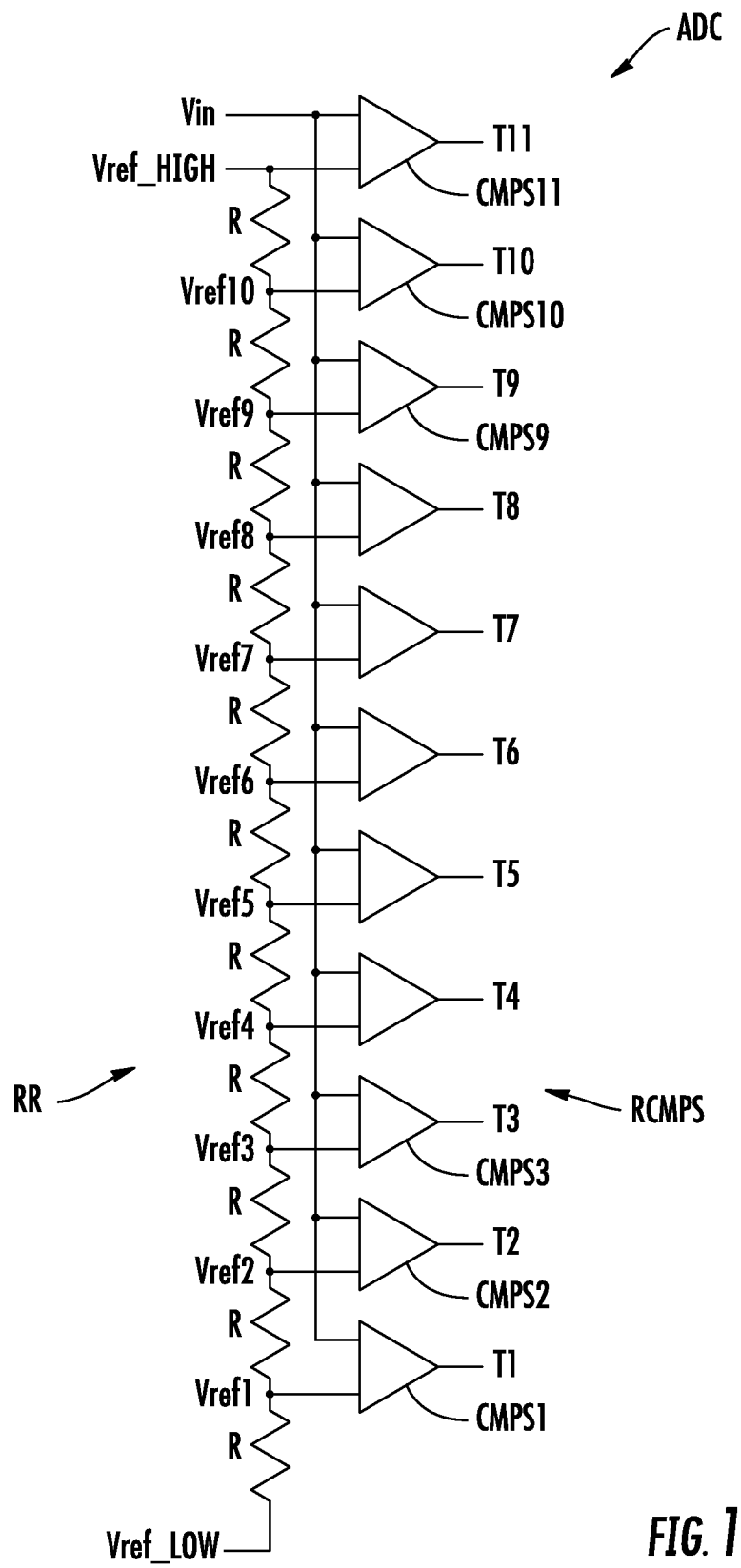

The secondary analog to digital conversion means ADC then comprise, as illustrated in FIG. 16, a network of secondary comparators RCMPS configured to perform a comparison of the secondary signal selected by the multiplexer MUX with reference thresholds evenly distributed between the values VrefL and VrefH. These reference thresholds Vrefi are delivered at the intermediate nodes of a resistive network RR.

Also, when the comparison stage CMP and the analog multiplexer MUX do not introduce error or introduce an error that is considered acceptable in the application considered, it is then sufficient to use, in the example described here, seven secondary comparators CMPS3-CMPS9 delivering seven bits T3-T9 also forming a thermometric code information item.

That said, when the imprecision generated by the comparators CMP and the analog multiplexer MUX is to be taken into account, it is preferable, as illustrated in FIG. 16, for the reference thresholds Vrefi to be even distributed between a bottom limit value Vref_low that is lower than the value VrefL of FIG. 14 and a top limit value Vref_high that is greater than the limit value VrefH of FIG. 14.

This amounts to adding, at the ends of the conversion scale, additional threshold levels embodied here by four additional secondary comparators, namely the secondary comparators CMPS1, CMPS2 and CMPS10-CMPS11. It then becomes helpful, as will be seen in detail hereinbelow, to perform a calibration procedure so that all desired output digital words together form a continuous binary digital code. This aspect will be returned to in more detail hereinbelow.

Therefore, as illustrated in FIG. 16, when additional secondary comparators are used, a thermometric code information item consisting of 11 bits T1-T11 is obtained at the output of the analog to digital converter ADC. In a manner similar to that described previously, this thermometric code information item T1-T11 is, as illustrated in FIG. 5, but also in FIGS. 17 and 18, converted into the second digital word MN2 by two conversion stages CV10 and CV20 forming second conversion means.

Figure 17:
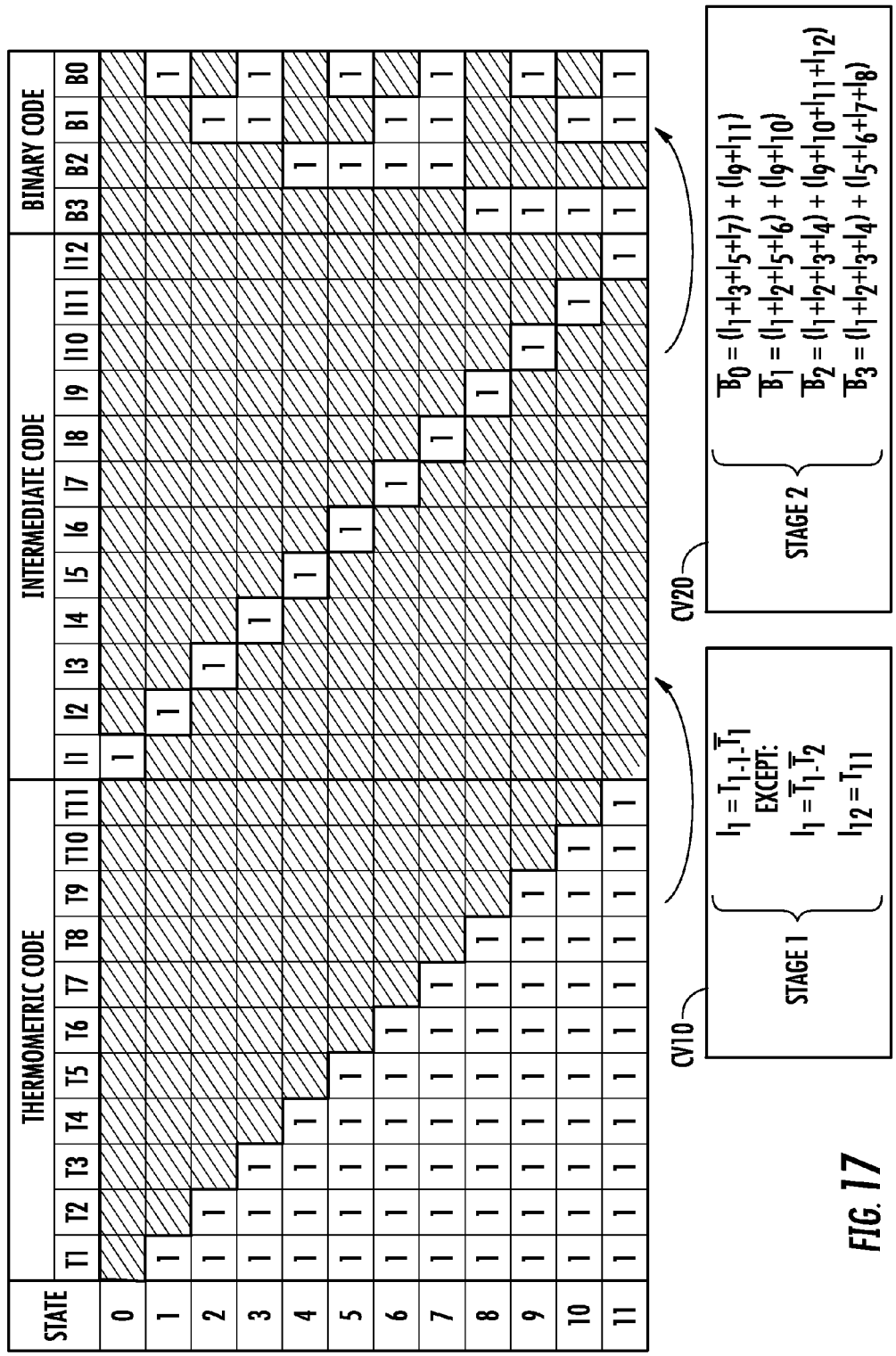

More specifically, the stage CV10 supplies an intermediate code from the thermometric code, by using the equations mentioned in FIG. 17, whereas the second conversion stage CV20 transforms the intermediate code I1-I12 into the four bits B0-B3 of the digital word MN2 by means of the equations also mentioned in FIG. 17. That said, as illustrated in FIG. 17, since there are only 12 bits I1 to I12, the four bits B0-B3 do not all take the 16 possible values, but only 12, which therefore fictitiously corresponds to 3.5 bits ($\sim 2^{3.5}$).

Figure 18:
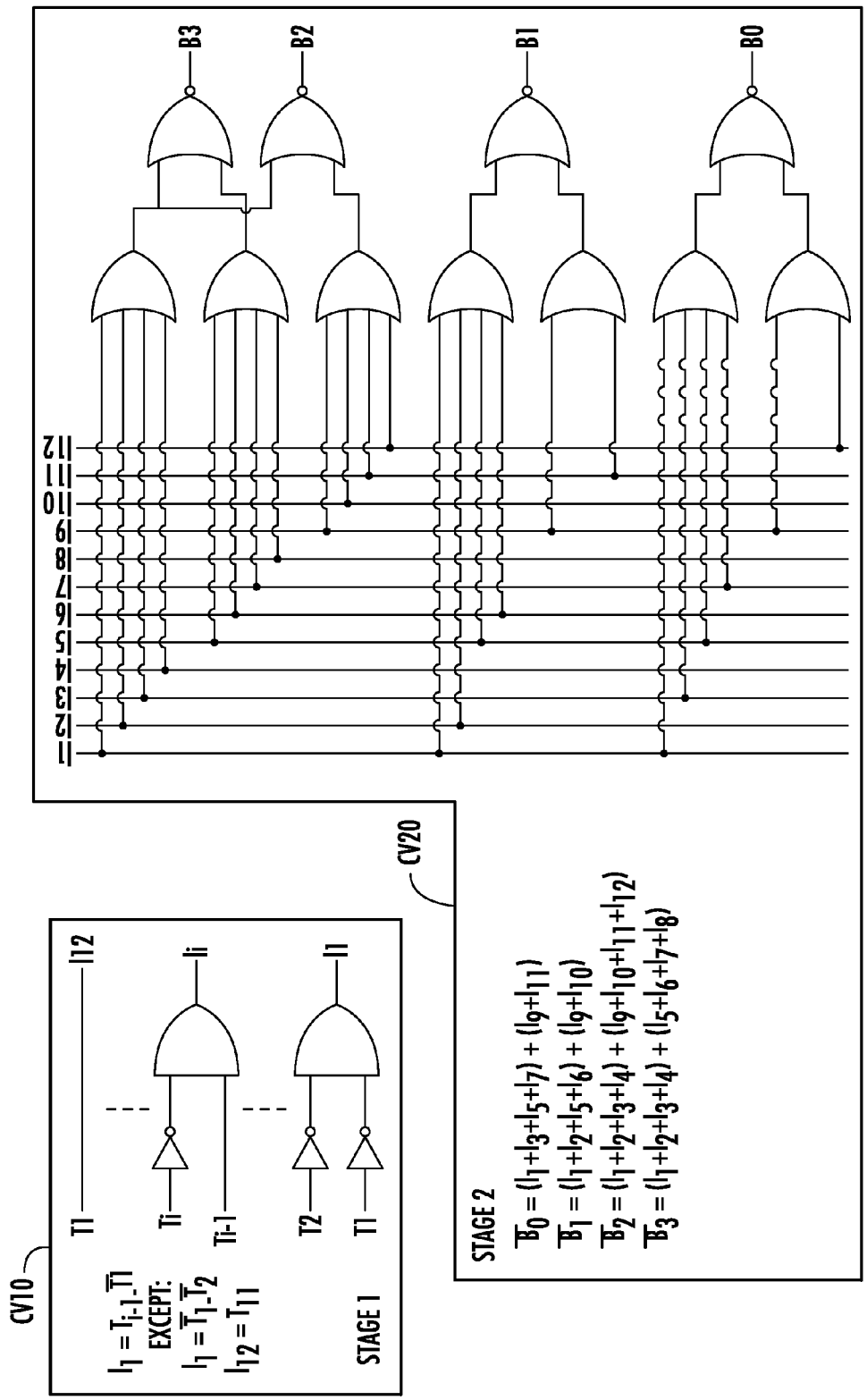

Physically, as illustrated in FIG. 18, the stages CV10 and CV20 may, for example, be produced by means of logic circuits comprising inverters and logic gates.

We will now return, referring more particularly to FIGS. 19 to 24, to the calibration of the logarithmic analog to digital conversion device DIS mentioned previously. The linearity of the device DIS depends on the correlation between the coarse bits and the fine bits which result in particular directly from the precision of the comparators CMP.

Figure 19:
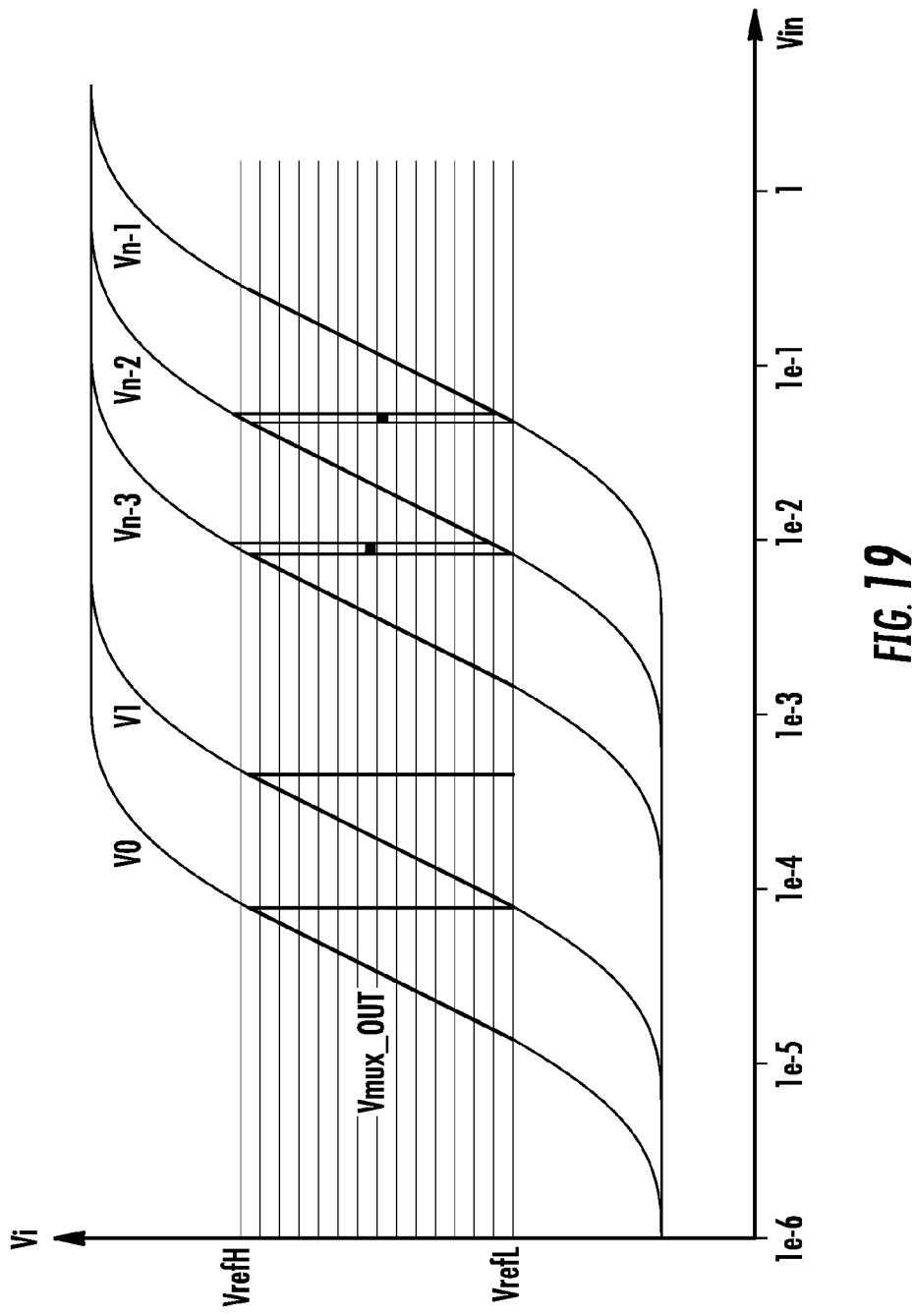

More specifically, as illustrated in FIG. 19, an error in the coarse conversion will induce an error in the selected segment of the secondary analog signal. Consequently, the output Vmux_out of the multiplexer MUX risks exceeding the conversion range of the secondary analog to digital converter ADC.

Figure 20:
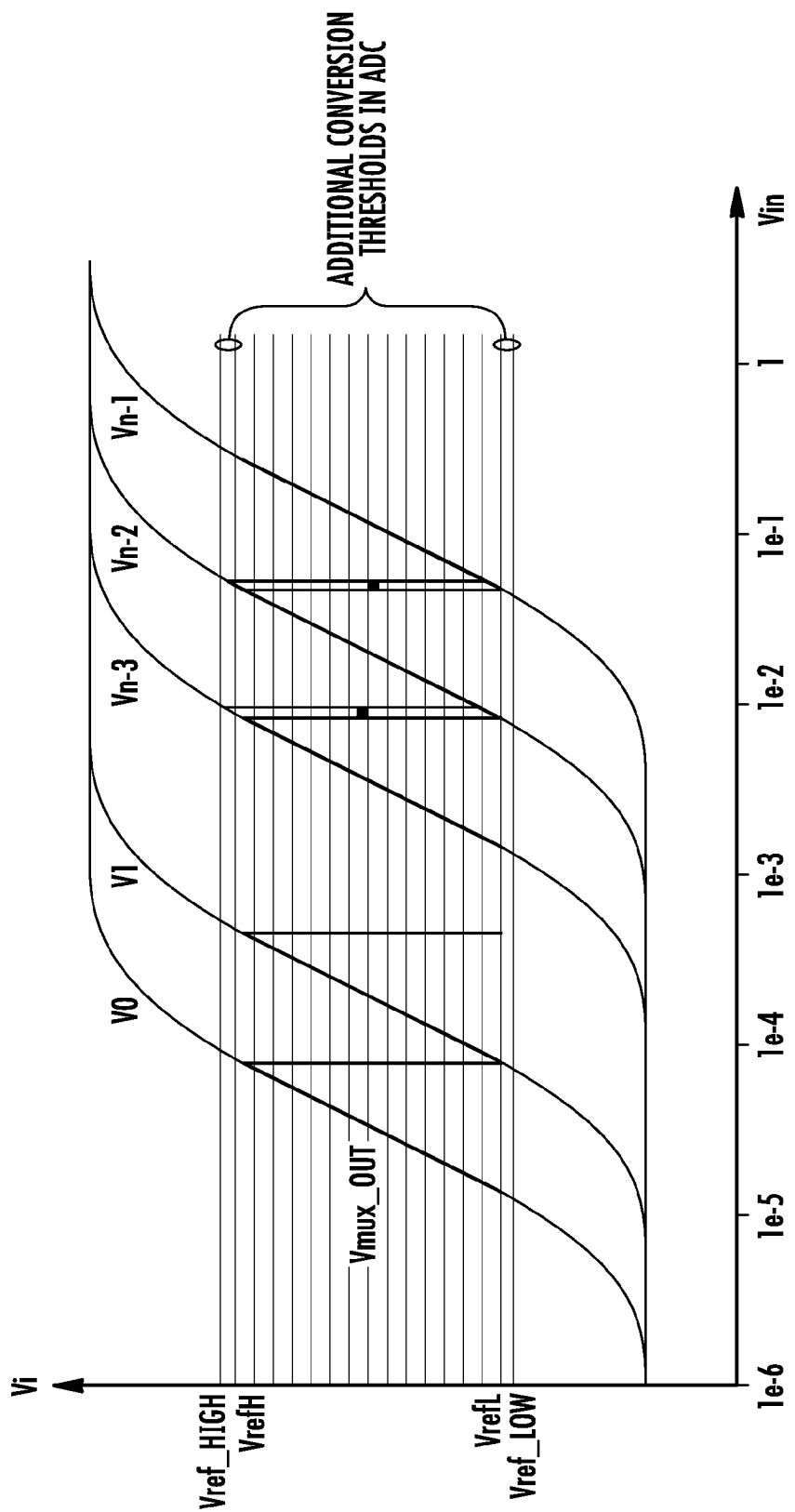

In practice, as illustrated in FIG. 19, certain segments actually selected may have levels that exceed the threshold VrefH or the threshold VrefL. This is why, in order to resolve this, provision is made, as illustrated in FIG. 20, for additional conversion thresholds in the secondary analog to digital converter ADC. The conversion thresholds will then be evenly situated between the bottom threshold Vref_low and the top threshold Vref_high.

This is reflected, in the particularly exemplary embodiment illustrated in FIG. 16, by the network of 11 secondary comparators CMPSi delivering the 11 bits of the thermometric information item T1-T11. That said, certain code values never appear because of the addition of these additional conversion threshold levels.

Figure 21:
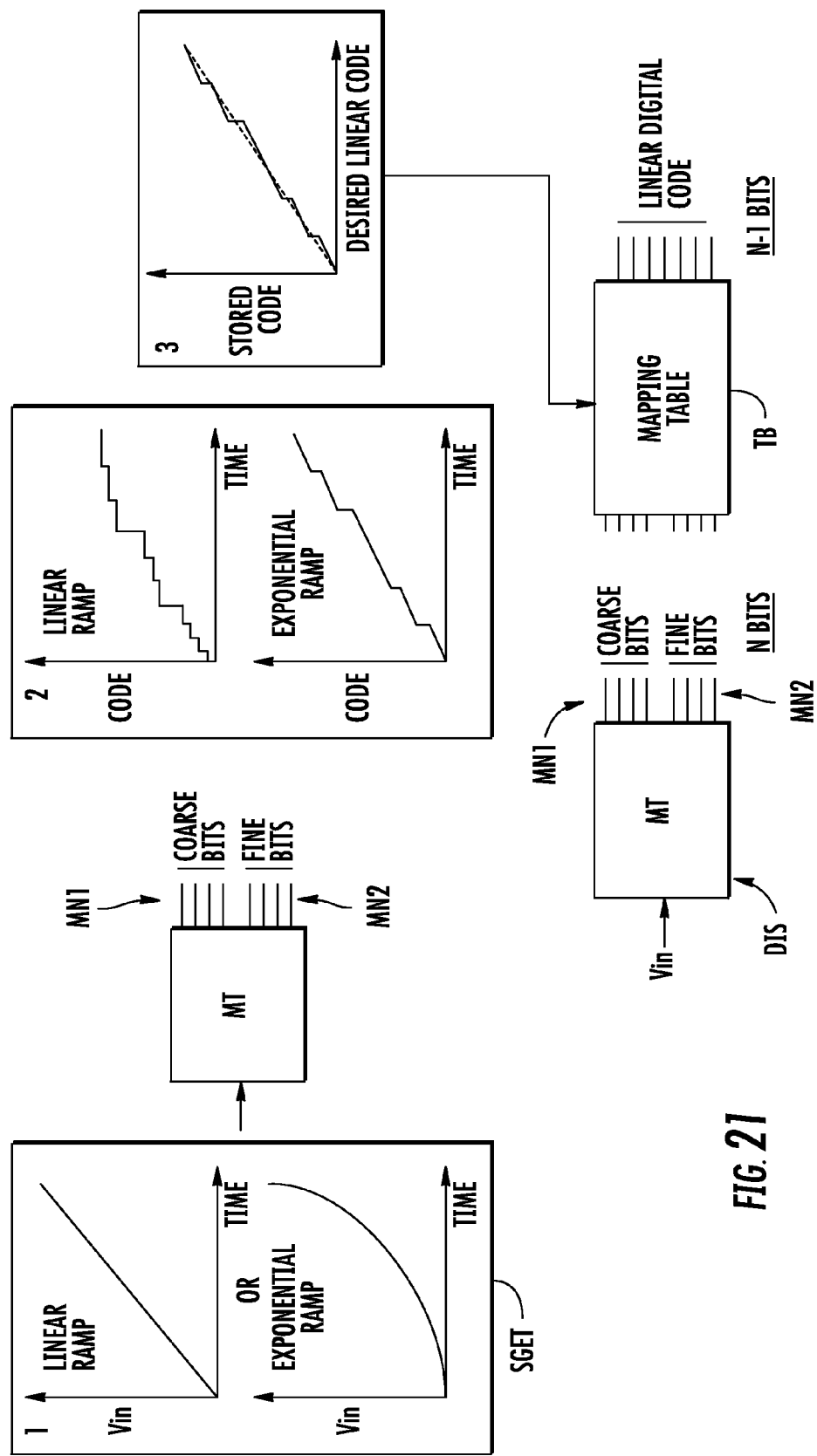

This is why provision is made to perform a calibration of the converter so as to correlate the fine bits and the coarse bits to form a unique continuous output digital code. An exemplary calibration procedure is illustrated in FIG. 21.

More specifically, an input signal SGET (calibration signal) in monotonic and continuous ramp form is applied as input to the processing means MT of the device DIS. This ramp may be a linear ramp or else an exponential ramp or even any monotonic function.

An exponential ramp will result in an even trend of the output over time whereas a linear ramp will induce a logarithmic output trend. The code (the coarse bits and fine bits) obtained is then stored and a mapping table is established between the stored code and the desired linear code (continuous) taking into account code values which should not appear. This mapping table TB thus makes it possible, for any digital word of N bits formed by the coarse bits and the fine bits delivered by the processing means MT, to deliver an output digital word MNS on N−1 bits, all the output digital words then forming a linear, that is to say continuous, digital code.

Figure 22:
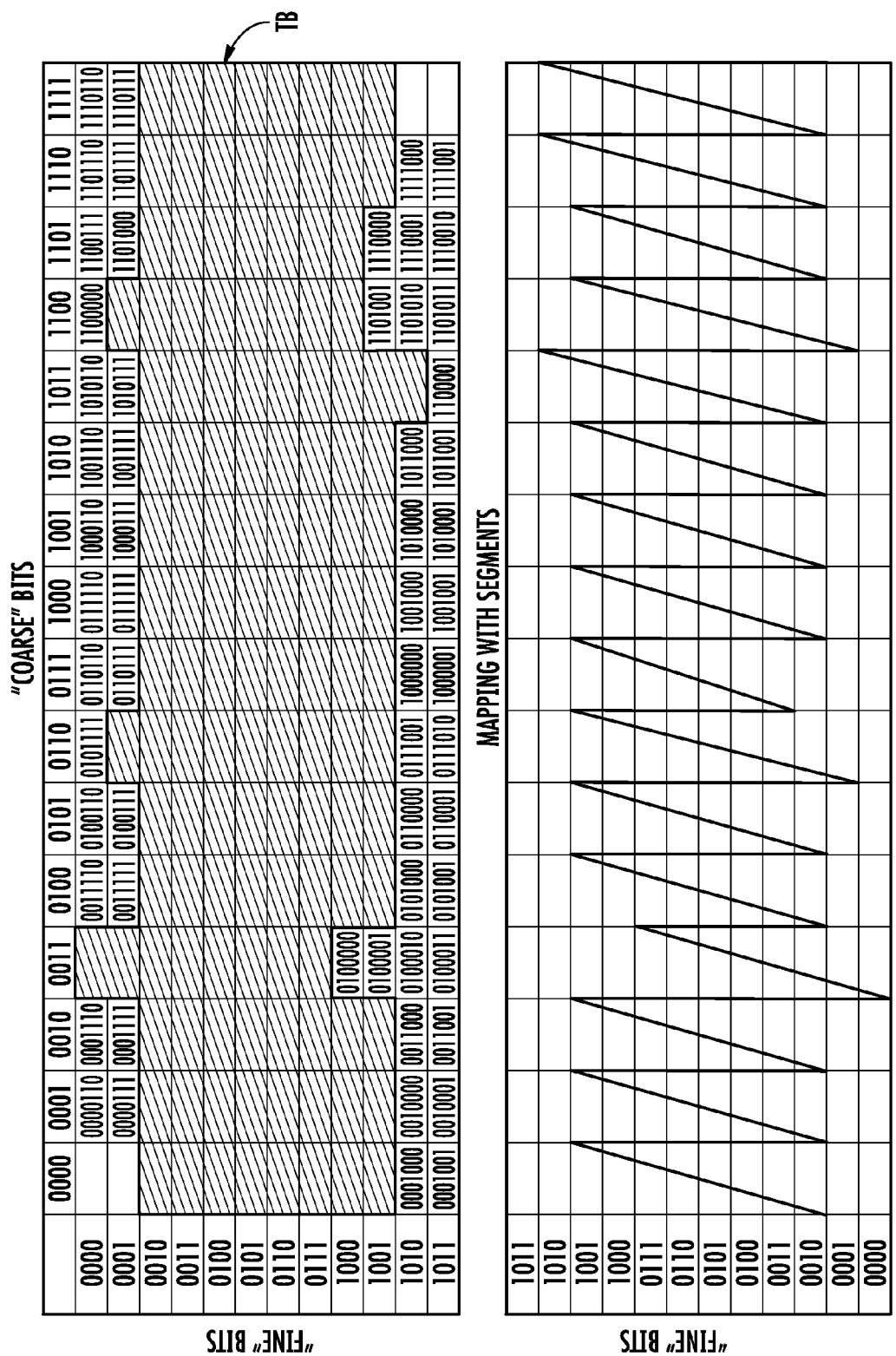

An exemplary mapping table TB is given in FIG. 22. Thus, it can be seen, in correlation with the segments (linear regions) illustrated in the bottom part of FIG. 22, that the code begins at the value 0000000 corresponding to the value 0010 for the digital word MN2 (fine bits) and to the value 0000 for the digital word MN1 (coarse bits), and ends with the value 1111111 corresponding to the values 1001 for the fine bits and the values 1111 for the coarse bits.

The output code contained in the table TB therefore takes all the values between the initial value and the final value.

By contrast, the code values situated outside this table are values which should not occur given the trend of the various segments. Thus, as an example, the value 0001000 corresponding to the values 1010 for the fine bits and to the value 0000 for the coarse bits should not occur. However, this code value 001000 now corresponds to the values 0010 of the fine bits and to the values 0001 of the coarse bits and makes it possible to ensure the continuity of the digital code defined by the content of the table TB.

Figure 24:
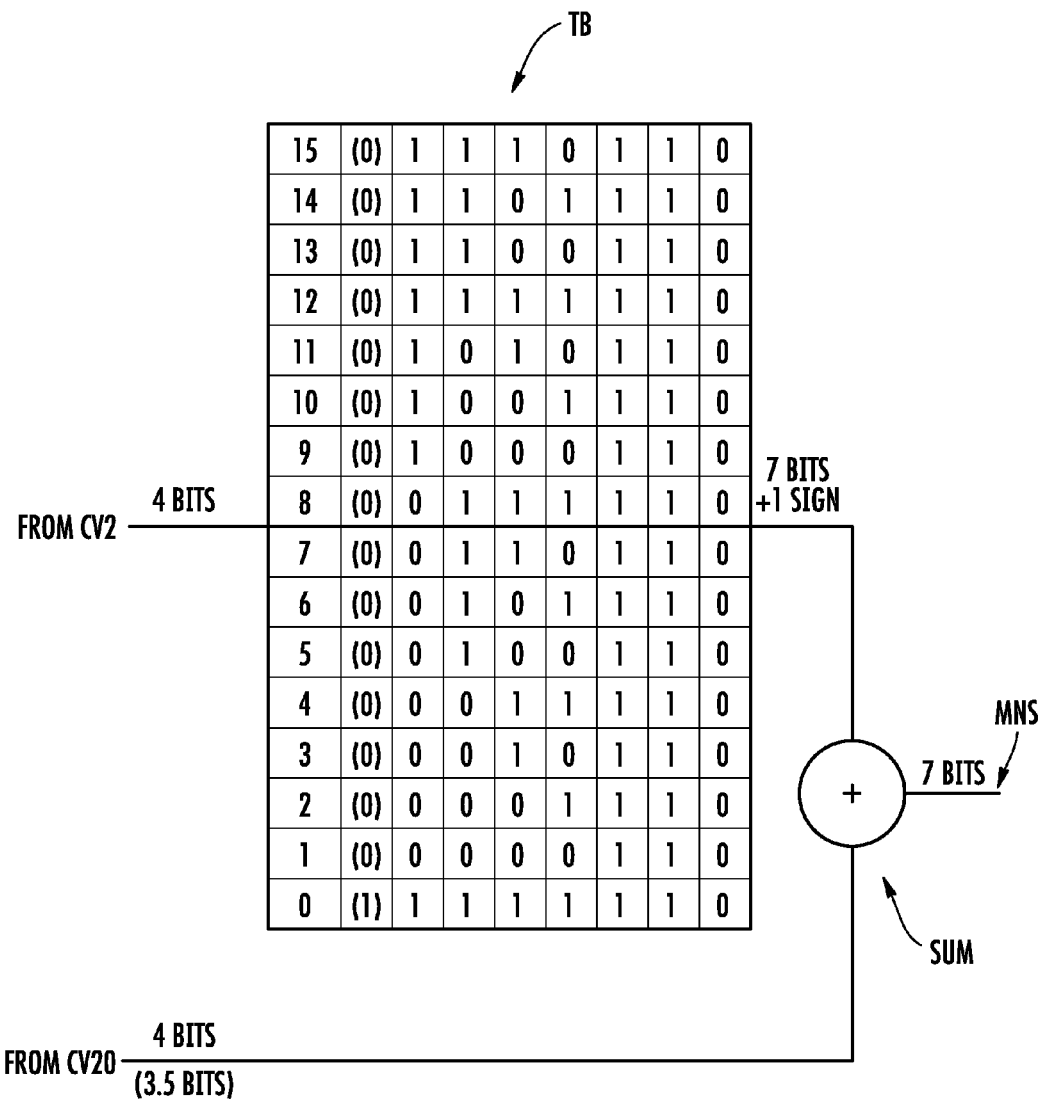

The linear continuity of the code is consequently preserved. A first approach may be to store all the table TB which will, in the example considered, supply as output 7 code bits (the bits C0-C6 of the output word MNS of FIG. 5) for each combination of the coarse bits and of the fine bits. Another, more optimized, approach includes simply storing a table TB of smaller size, such as that illustrated in FIG. 23. This table TB supplies a 7-bit code for the various values of the coarse bits, the various elements of this table simply having to be added to the fine bits to form the bits of the output word, as illustrated in FIG. 24.

More specifically, the 7-bit output word MNS is obtained by summation in a summer SUM, of the bits B0-B3 delivered by the conversion stage CV20 and a 7-bit word extracted from the table TB which is stored in read-only memory. The various words stored in the table TB are selected by the value of the bits B4-B7 delivered by the conversion block CV2, which define the addresses in the storage memory.

One way of obtaining this optimized table is to apply a voltage ramp to the input of the logarithmic analog to digital converter DIS. The calibration means or circuitry then comprises a counter configured to count the number of modifications in the values of the bits of the digital word MN2 (fine bits). The corresponding value of the word MN2 is subtracted, in a subtractor, from the corresponding value of the counter upon each modification of the value of the word MN1 (coarse bits) and the result of this subtraction is stored in the table.

It should be noted here that this calibration procedure can be performed in situ within the very device DIS (then referred to as self-calibration) or else during the manufacturing of the device.

The device that has just been described exhibits a wide dynamic conversion range which depends on the number of amplifiers of the means or circuitry MAL.

The result is consequently a wide production flexibility which is all the greater because of the optional nature of the elements implanting the fine conversion.

The frequency bandwidth of the device is fixed only by that of the amplifiers. The structure of the device offers low current consumption at low power supply voltages, for example 1.2 volts.

The device DIS that has just been described can, moreover, easily be produced in integrated form within an integrated circuit that may contain other functional blocks. It also has a reduced surface area, for example less than 0.02 mm$^2$ in a 65 nm CMOS technology.

Figure 25:
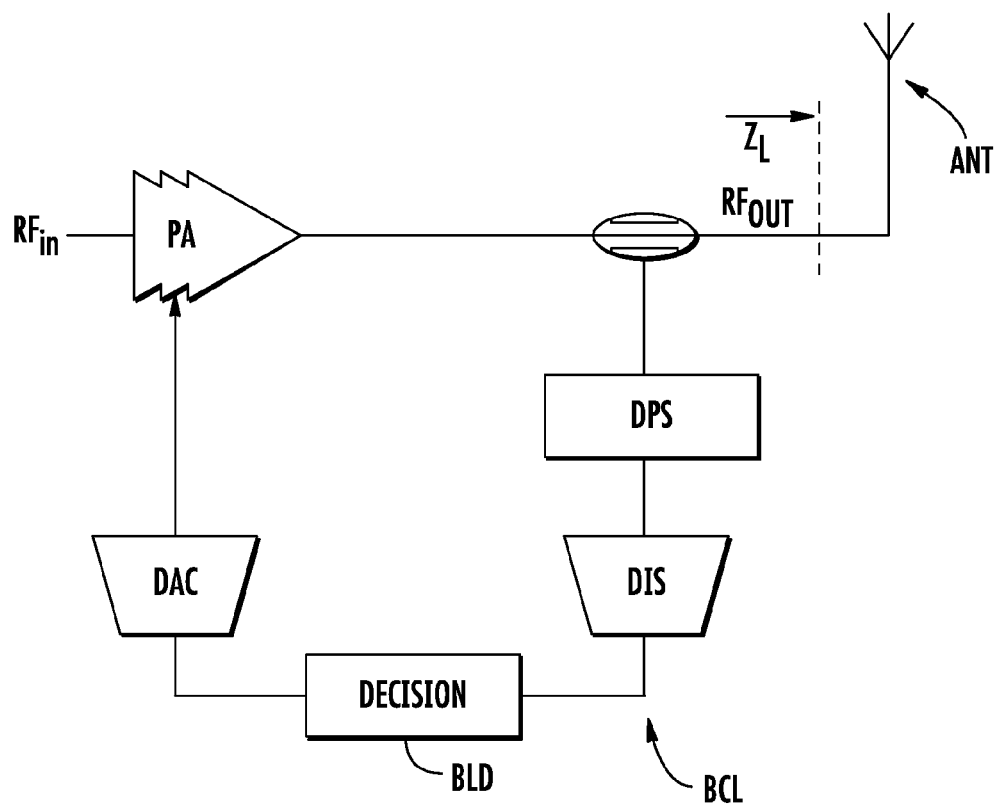

It can, for example, be easily incorporated in a software radiofrequency reception chain. Another exemplary application of the device DIS is illustrated in FIG. 25.

The application described here aims more particularly for the W-HDMI 60 GHz radiofrequency architectures and relates to a power amplifier PA controlled by a digital control loop BCL working at 1 MHz. The transmission chain comprises a detector DPS of the power of the signal $RF_{out}$ delivered by the power amplifier PA, the device DIS described previously, a decision block BLD and a digital/analog converter DAC. It is thus possible to compensate a mismatching of the antenna impedance ANT known to those skilled in the art by the designation VSWR (Voltage Standing Wave Ratio).

That which is claimed:

1. A method for analog to digital conversion comprising:
performing a logarithmic amplification of an input analog signal with a progressive compression using logarithmic amplification circuitry including a chain of amplifier stages to thereby generate a sequence of secondary analog signals, each amplifier stage configured to deliver a secondary analog signal, and a trend of values of at least some of the sequence of secondary analog signals being based upon values of the analog input signal and including regions corresponding to a linear trend of the sequence of secondary analog signals as a function of the analog signal expressed in a logarithmic scale;
performing a comparison of at least some of the sequence of secondary signals with a common reference signal having a value lying within each of the regions to thereby generate a thermometric code; and
generating a first digital word from the thermometric code.

2. A method according to claim 1, wherein the value of the common reference signal is such that, when a secondary signal of rank i in the sequence of secondary analog signals takes a value equal to the value of the common reference signal, a corresponding value of a given signal of the sequence of secondary analog signals of rank i−1 lies within the region of the given signal of rank i−1.

3. A method according to claim 1, wherein the value of the common reference signal is within a threshold of a bottom value of each region.

4. A method according to claim 1, wherein generating the first digital word comprises:
   converting the thermometric code into an intermediate code, a bit of rank i of the intermediate code being obtained from a product of a complement of the bit of rank I, one of a bit of rank i−1 and a complement of the bit of rank i−1, and the thermometric code; and
   converting the intermediate code into a binary code forming the first digital word.

5. A method according claim 1, further comprising:
   selecting one the sequence of secondary signals based upon the thermometric code;
   performing an analog to digital conversion of the selected signal into a secondary thermometric code; and
   converting the secondary thermometric into a second digital word, the first and second digital words respectively forming first and second portions of an output digital word, the second portion having a lower significance than the first portion.

6. A method according to claim 5, wherein the selection of one of the sequence of secondary signals is also based upon the intermediate code.

7. A method according claims 5, wherein the regions extend at least between a first common bottom limit value and a first common top limit value; and wherein the analog to digital conversion of the selected signal is performed by a comparison of the secondary signal with reference thresholds evenly distributed between the first common bottom limit value and the first common top limit value.

8. A method according to claim 7, wherein the analog to digital conversion of the selected signal is performed by a comparison of the selected signal with reference thresholds evenly distributed between a second bottom limit value lower than the first common bottom limit value and a second top limit value higher than the first common top limit value; and further comprising:
   calibrating the digital to analog conversion of the selected signal with an analog calibration signal, the analog calibration signal following a monotonic time trend; and
   generating of a mapping table between the first and second digital words during the analog to digital conversion of the selected signal to thereby form a continuous binary digital code.

9. A method for analog to digital conversion comprising:
   performing an amplification of an input analog signal using logarithmic amplification circuitry including a chain of amplifier stages to thereby generate a sequence of secondary analog signals, each amplifier stage configured to deliver a secondary analog signal, and a trend of values of at least some of the sequence of secondary analog signals being based upon values of the analog input signal and including regions corresponding to a linear trend of the sequence of secondary analog signals;
   performing a comparison of at least some of the sequence of secondary signals with a common reference signal having a value lying within each of the regions to thereby generate a thermometric code; and
   generating a first digital word from the thermometric code.

10. A method according to claim 1, wherein the value of the common reference signal is such that, when a secondary signal of rank i in the sequence of secondary analog signals takes a value equal to the value of the common reference signal, a corresponding value of a given signal of the sequence of secondary analog signals of rank i−1 lies within the region of the given signal of rank i−1.

11. A method according to claim 9, wherein the value of the common reference signal is within a threshold of a bottom value of each region.

12. A method according to claim 9, wherein generating the first digital word comprises:
   converting the thermometric code into an intermediate code, a bit of rank i of the intermediate code being obtained from a product of a complement of the bit of rank I, one of a bit of rank i−1 and a complement of the bit of rank i−1, and the thermometric code; and
   converting the intermediate code into a binary code forming the first digital word.

13. A method according to claim 9, further comprising:
   selecting one the sequence of secondary signals based upon the thermometric code;
   performing an analog to digital conversion of the selected signal into a secondary thermometric code; and
   converting the secondary thermometric into a second digital word, the first and second digital words respectively forming first and second portions of an output digital word, the second portion having a lower significance than the first portion.

14. A method according to claim 13, wherein the selection of one of the sequence of secondary signals is also based upon the intermediate code.

15. A method according to claim 13, wherein the regions extend at least between a first common bottom limit value and a first common top limit value; and wherein the analog to digital conversion of the selected signal is performed by a comparison of the secondary signal with reference thresholds evenly distributed between the first common bottom limit value and the first common top limit value.

16. A method according to claim 15, wherein the analog to digital conversion of the selected signal is performed by a comparison of the selected signal with reference thresholds evenly distributed between a second bottom limit value lower than the first common bottom limit value and a second top limit value higher than the first common top limit value; and further comprising:
   calibrating the digital to analog conversion of the selected signal with an analog calibration signal, the analog calibration signal following a monotonic time trend; and
   generating of a mapping table between the first and second digital words during the analog to digital conversion of the selected signal to thereby form a continuous binary digital code.

17. An electronic device comprising:
   input circuitry configured to receive an analog input signal; and
   processing circuitry coupled to the input circuitry and comprising
      logarithmic amplification circuitry with progressive compression coupled to the input circuitry and including a chain of amplifier stages, each amplifier stage configured to deliver a secondary analog signal, a trend of values of the sequence of secondary analog signals being based upon values of the analog input signal and including regions corresponding to a linear trend of the sequence of secondary analog signals as a function of the analog signal expressed in a logarithmic scale, a plurality of comparison circuits respectively having
first inputs coupled to outputs of at least some of the amplifier stages,
second inputs configured to receive a common reference signal having a value lying within each of the regions, and
outputs configured to deliver a thermometric code, and first connection circuitry coupled to outputs of the comparison circuitry and configured to deliver a first digital word based upon the thermometric code.

18. An electronic device according to claim 17, wherein the value of the common reference signal is such that, when a secondary signal of rank i in the sequence of secondary analog signals takes a value equal to the value of the common reference signal, a corresponding value of a given signal of the sequence of secondary analog signals of rank i-1 lies within the region of the given signal of rank i-1.

19. An electronic device according to claim 17, wherein the value of the common reference signal is within a threshold of a bottom value of each region.

20. An electronic device according to claim 17, wherein the first conversion circuitry comprises a first conversion block configured to convert the thermometric code into an intermediate code, a bit of rank i of the intermediate code being obtained from a product of a complement of the bit of rank I, one of a bit of rank i-1 and a complement of the bit of rank i-1, and the thermometric code, and a second conversion block configured to convert the intermediate code into a binary code forming the first digital word.

21. An electronic device according to claim 17, wherein the processing circuitry further comprises:
multiplexing circuitry having several inputs respectively connected to outputs of at least some of the amplifier stages, an output, and a command input coupled to outputs of the comparison circuitry;
secondary analog to digital conversion circuitry coupled to the output of the multiplexing circuitry and configured to deliver a secondary thermometric code; and
second conversion circuitry configured to convert the secondary thermometric code into a second digital word based upon a secondary signal delivered at the output of the multiplexing circuitry, the first and second digital words respectively forming first and second portions of an output digital word, the second portion having a lower significance than the first portion.

22. An electronic device according to claim 20, wherein the command input is coupled to an output of the first conversion block.

23. An electronic device according to claim 21, wherein the regions extend at least between a first common bottom limit value and a first common top limit value; and wherein the second analog to digital conversion circuitry comprises a network of secondary comparators configured to perform a comparison of the secondary signal with reference thresholds evenly distributed between the first common bottom limit value and the first common top limit value.

24. An electronic device according to claim 23, wherein the secondary analog to digital conversion circuitry comprises:
a network of secondary comparators configured to perform a comparison of the secondary signal with reference thresholds evenly distributed between a second bottom limit value lower than the first common bottom limit value and a second top limit value higher than the first common top limit value; and
calibration circuitry configured to calibrate of the processing circuitry with an analog calibration signal, the calibration signal following a monotonic time trend, the calibration circuitry including generation circuitry configured to generate a mapping table between the first and second digital words during the analog to digital conversion of the selected signal to thereby form a continuous binary digital code.

25. An electronic device according to claim 24, in which the mapping table is coupled to an output of the first conversion circuitry.

26. An electronic device comprising:
logarithmic amplification circuitry with progressive compression coupled to an analog input signal and including a chain of amplifier stages, each amplifier stage configured to deliver a secondary analog signal, a trend of values of the sequence of secondary analog signals being based upon values of the analog input signal and including regions corresponding to a linear trend of the sequence of secondary analog signals as a function of the analog signal expressed in a logarithmic scale;
a plurality of comparison circuits respectively having
first inputs coupled to outputs of at least some of the amplifier stages,
second inputs configured to receive a common reference signal having a value lying within each of the regions, and
outputs configured to deliver a thermometric code; and
first connection circuitry coupled to outputs of the comparison circuitry and configured to deliver a first digital word based upon the thermometric code.

27. An electronic device according to claim 26, wherein the value of the common reference signal is such that, when a secondary signal of rank i in the sequence of secondary analog signals takes a value equal to the value of the common reference signal, a corresponding value of a given signal of the sequence of secondary analog signals of rank i-1 lies within the region of the given signal of rank i-1.

28. An electronic device according to claim 26, wherein the value of the common reference signal is within a threshold of a bottom value of each region.

29. An electronic device according to claim 26, wherein the first conversion circuitry comprises a first conversion block configured to convert the thermometric code into an intermediate code, a bit of rank i of the intermediate code being obtained from a product of a complement of the bit of rank I, one of a bit of rank i-1 and a complement of the bit of rank i-1, and the thermometric code, and a second conversion block configured to convert the intermediate code into a binary code forming the first digital word.

* * * * *